(12) United States Patent
Lee et al.

(10) Patent No.: US 11,881,547 B2
(45) Date of Patent: Jan. 23, 2024

(54) DISPLAY DEVICE AND METHOD OF MANUFACTURING THE SAME

(71) Applicant: Samsung Display Co., LTD., Yongin-si (KR)

(72) Inventors: Hang Jae Lee, Yongin-si (KR); Yuk Hyun Nam, Yongin-si (KR); Sang Hoon Park, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 267 days.

(21) Appl. No.: 17/227,937

(22) Filed: Apr. 12, 2021

(65) Prior Publication Data

US 2022/0093836 A1 Mar. 24, 2022

(30) Foreign Application Priority Data

Sep. 18, 2020 (KR) .......................... 10-2020-0120897

(51) Int. Cl.
*H01L 33/62* (2010.01)
*H01L 25/16* (2023.01)

(52) U.S. Cl.
CPC ............ *H01L 33/62* (2013.01); *H01L 25/167* (2013.01); *H01L 2933/0066* (2013.01)

(58) Field of Classification Search
CPC ............ H01L 33/62; H01L 25/167; H01L 2933/0066; H01L 25/0753; H01L 27/1214; G09F 9/00; C08K 5/05; C08K 5/053; C08K 5/3415; C08K 5/45; C08L 65/00; H01B 1/127; H01B 1/128
See application file for complete search history.

(56) References Cited

U.S. PATENT DOCUMENTS

| | | | | |
|---|---|---|---|---|
| 2015/0333221 | A1* | 11/2015 | Bibl | H01L 21/6835 438/34 |
| 2016/0181476 | A1* | 6/2016 | Chang | H01L 33/06 257/13 |
| 2019/0006329 | A1* | 1/2019 | Hashim | H01L 25/0753 |
| 2019/0115274 | A1* | 4/2019 | Hu | H01L 25/167 |
| 2021/0028153 | A1* | 1/2021 | Sakariya | H01L 33/06 |
| 2021/0056873 | A1* | 2/2021 | Jung | H10K 59/121 |
| 2021/0280741 | A1* | 9/2021 | Lo | H01L 25/0753 |

FOREIGN PATENT DOCUMENTS

| KR | 10-1628345 | 6/2016 |
|---|---|---|
| KR | 10-2020-0042075 | 4/2020 |

* cited by examiner

*Primary Examiner* — Victor A Mandala
(74) *Attorney, Agent, or Firm* — KILE PARK REED & HOUTTEMAN PLLC

(57) ABSTRACT

A display device may include a substrate, and a display element layer disposed on the substrate and including a light emitting element that emits light in a display direction. The display element layer may include a first contact electrode electrically connected to the light emitting element, a second contact electrode electrically connected to the light emitting element, and a bank pattern having a shape extending in the display direction. At least one of the first contact electrode, the second contact electrode, and the bank pattern may include a transparent conductive polymer.

8 Claims, 18 Drawing Sheets

DISPLAY DEVICE AND METHOD OF MANUFACTURING THE SAME

CROSS-REFERENCE TO RELATED APPLICATION(S)

This application claims priority to and benefits of Korean Patent Application No. 10-2020-0120897 under 35 U.S.C. § 119, filed in the Korean Intellectual Property Office on Sep. 18, 2020, the entire contents of which are incorporated herein by reference.

BACKGROUND

1. Technical Field

Various embodiments of the disclosure relate to a display device and a method of manufacturing the same.

2. Description of the Related Art

Recently, as interest in information display increases, research and development on display devices has been continuously conducted.

SUMMARY

Various embodiments of the disclosure are directed to a display device capable of reducing processing cost, and a method of manufacturing the display device.

The disclosure is not limited to the above-described aspects, and other aspects that are not mentioned will be clearly understood by those skilled in the art from the following description.

An embodiment of the disclosure may provide a display device that may include a substrate, and a display element layer disposed on the substrate and including a light emitting element that emits light in a display direction. The display element layer may include a first contact electrode electrically connected to the light emitting element, a second contact electrode electrically connected to the light emitting element, and a bank pattern having a shape extending in the display direction. At least one of the first contact electrode, the second contact electrode, and the bank pattern may include a transparent conductive polymer.

In an embodiment, the first contact electrode, the second contact electrode, and the bank pattern each may be formed of a transparent conductive polymer having a same composition ratio.

In an embodiment, the first contact electrode and the second contact electrode may be disposed between the substrate and the light emitting element.

In an embodiment, the display device may further include a first electrode electrically connected to the first contact electrode through a first contact hole, and a second electrode electrically connected to the second contact electrode through a second contact hole.

In an embodiment, the display device may further include a first insulating layer disposed on the first electrode and the second electrode. The first contact hole and the second contact hole may be disposed in the first insulating layer. The first contact electrode, the second contact electrode, and the bank pattern may be disposed on the first insulating layer.

In an embodiment, the transparent conductive polymer may include at least one of poly(3,4-ethylenedioxythiophene):polystyrene sulfonate (PEDOT:PSS), polyacetylene, polypyrrole, polythiophene, poly(para-phenylene), poly(3,4-ethlenedixoythiophene), polyphenylene sulfide, poly(para-phenylene vinylene), and polyaniline.

In an embodiment, the transparent conductive polymer may include at least one of dimethyl sulfoxide, N-methylpyrrolidone, ethylene glycol, methanol, ethanol, and isopropyl alcohol.

An embodiment of the disclosure may provide a method of manufacturing a display device that may include preparing a substrate, forming a first electrode and a second electrode on the substrate, disposing a first insulating layer to cover the first electrode and the second electrode, disposing a transparent conductive polymer layer on the first insulating layer, disposing a photoresist layer including photosensitive material on the transparent conductive polymer layer, removing at least part of the photoresist layer using a mask, etching the transparent conductive polymer layer using an etching mask, wherein the etching mask is the photoresist layer of which the at least part is removed, and disposing a light emitting element that emits light in a display direction.

In an embodiment, the etching of the transparent conductive polymer layer may include forming a first contact electrode electrically connected to an end of the light emitting element, and forming a second contact electrode electrically connected to another end of the light emitting element.

In an embodiment, the etching of the transparent conductive polymer layer may include forming a bank pattern having a shape extending in the display direction.

In an embodiment, the etching of the transparent conductive polymer layer may include forming the first contact electrode, the second contact electrode, and the bank pattern at a same time.

In an embodiment, the disposing of the light emitting element may be performed after the etching of the transparent conductive polymer, and at least a portion of the first contact electrode and at least a portion of the second contact electrode may be disposed between the substrate and the light emitting element.

In an embodiment, at least a portion of the transparent conductive polymer layer may be provided as the first and the second contact electrodes by the etching of the transparent conductive polymer layer, and at least another portion of the transparent conductive polymer layer may be provided as the bank pattern by the etching of the transparent conductive polymer layer.

In an embodiment, the mask may include a first mask area having a first transmissivity, and a second mask area having a second transmissivity greater than the first transmissivity. The removing of the at least part of the photoresist layer may include providing a portion of the transparent conductive polymer layer that corresponds to the first mask area of the mask as the first contact electrode and the second contact electrode, and providing another portion of the transparent conductive polymer layer that corresponds to the second mask area of the mask as the bank pattern.

In an embodiment, the first mask area may include a half-tone area, and the second mask area may include a full-tone area.

In an embodiment, the transparent conductive polymer layer may include at least one of poly(3,4-ethylenedioxythiophene):polystyrene sulfonate (PEDOT:PSS), polyacetylene, polypyrrole, polythiophene, poly(para-phenylene), poly(3,4-ethlenedixoythiophene), polyphenylene sulfide, poly(para-phenylene vinylene), and polyaniline.

In an embodiment, the disposing of the first insulating layer may include, forming in the first insulating layer a first through hole connected to the first electrode in a fluidic manner, and forming in the first insulating layer a second through hole connected to the second electrode in a fluidic manner.

In an embodiment, in the disposing of the transparent conductive polymer layer may include providing at least a portion of the transparent conductive polymer layer in the first through hole and the second through hole, forming a first contact hole to electrically connect the first electrode to the transparent conductive polymer layer, and forming a second contact hole to electrically connect the second electrode to the transparent conductive polymer layer.

In an embodiment, the first contact electrode, the second contact electrode, and the bank pattern each may be formed of a transparent conductive polymer having a same composition ratio.

The technical solutions of the disclosure may not be limited to the above, and other technical solutions of the disclosure will be clearly understandable to those having ordinary skill in the art from the disclosures provided below together with accompanying drawings.

DETAILED DESCRIPTION OF THE EMBODIMENTS

Figure 1:
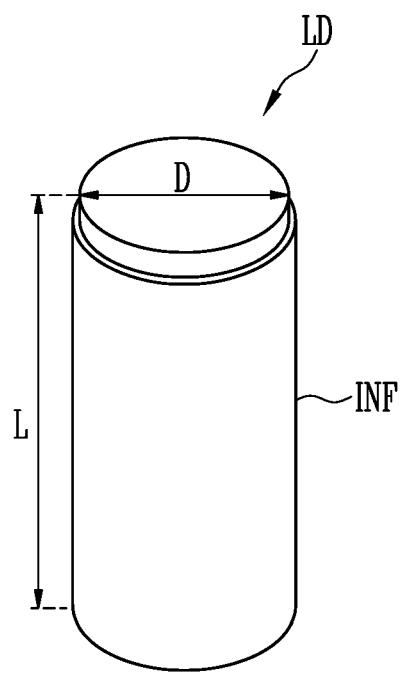
FIGS. 1 and 2 are a schematic perspective view and a schematic sectional view illustrating a light emitting element in accordance with an embodiment of the disclosure.

Embodiments described in this specification are made to clearly explain the scope of the disclosure to those having ordinary skill in the art, and are not intended to limit the disclosure. The disclosure may include substitutions and modifications within the spirit of the disclosure. The terms used herein are selected from general terms, which are widely used currently, based on functions of components according to embodiments of the disclosure, and may have meanings varying according to the intentions of those skilled in the art, the custom in the field of art, or advent of new technology. If a specific term is used with a specific meaning, the meaning of the term will be described specifically. Accordingly, the terms used in this specification should not be defined as simple names of the components, but be defined based on the actual meaning of the terms and the whole context throughout the specification.

Singular terms (e.g., "a", "an", "the") may include the plural and vice versa, unless the context clearly indicates otherwise. Terms such as "comprising", "having", and "including" specify the presence of stated elements but do not preclude the presence or addition of one or more other elements.

The accompanying drawings are to facilitate the explanation of the disclosure and the shape in the drawings may be exaggerated for the purpose of convenience of explanation, so the disclosure should not be limited to the drawings.

If in the specification, detailed descriptions of well-known functions or configurations would unnecessarily obfuscate the gist of the disclosure, such descriptions will be omitted.

Various embodiments of the disclosure relate to a display device and a method of manufacturing the same.

The term "overlap" may include layer, stack, face or facing, extending over, extending under, covering or partly covering or any other suitable term as would be appreciated and understood by those of ordinary skill in the art.

In the specification and the claims, the phrase "at least one of" is intended to include the meaning of "at least one selected from the group of" for the purpose of its meaning and interpretation. For example, "at least one of A and B" may be understood to mean "A, B, or A and B."

The term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

"About" or "approximately" or "substantially" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 5% of the stated value.

Hereinafter, a display device and a method of manufacturing the display device in accordance with an embodiment will be described with reference to FIGS. 1 to 18.

Figure 2:
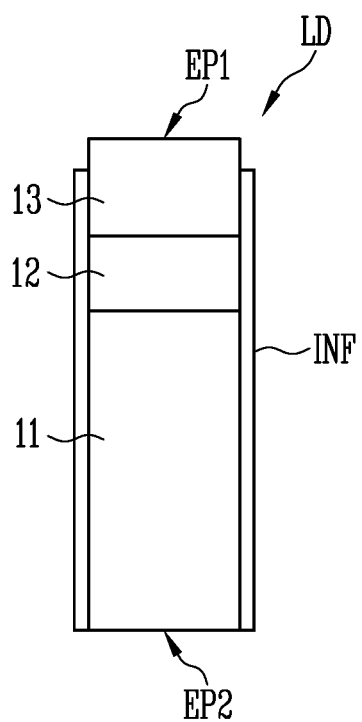

FIGS. 1 and 2 are a schematic perspective view and a schematic sectional view illustrating a light emitting element in accordance with an embodiment of the disclosure. Although FIGS. 1 and 2 illustrate a column-type light emitting element LD, the type and/or shape of the light emitting element LD is not limited thereto.

Referring to FIGS. 1 and 2, the light emitting element LD may include a first semiconductor layer 11, a second semiconductor layer 13, and an active layer 12 disposed (e.g., interposed) between the first and second semiconductor layers 11 and 13. For example, if a direction in which the light emitting element LD extends refers to a longitudinal direction (L), the light emitting element LD may include the first semiconductor layer 11, the active layer 12, and the second semiconductor layer 13 which may be disposed (e.g., successively stacked on each other) in the longitudinal direction (L).

The light emitting element LD may be disposed (e.g., provided) in the form of a column extending in a direction. The light emitting element LD may include a first end EP1 and a second end EP2. The first or second semiconductor layers 11 and 13 may be disposed on the first end EP1 of the light emitting element LD. Another of the first and second semiconductor layers 11 and 13 may be disposed on the second end EP2 of the light emitting element LD.

In an embodiment, the light emitting element LD may be a light emitting element manufactured in a column shape through an etching method or the like. The term "column-type" embraces a rod-like shape and a bar-like shape such as a cylindrical shape and a prismatic shape extending in a longitudinal direction (e.g., to have an aspect ratio greater than 1), and the cross-sectional shape thereof is not limited to a particular shape. For example, the length L of the light emitting element LD may be greater than a diameter D thereof (or a width of the cross-section thereof).

The light emitting element LD may have a small size corresponding to a range from the nanometer scale to the micrometer scale. For example, each light emitting element LD may have a diameter D (or a width) and/or a length L ranging from the nanometer scale to the micrometer scale. However, the size of the light emitting element LD is not limited thereto, and the size of the light emitting element LD may be changed in various ways depending on design conditions of various devices, e.g., a display device, using a light emitting device with the light emitting element LD as a light source.

The first semiconductor layer 11 may be a first conductive semiconductor layer. For example, the first semiconductor layer 11 may include an N-type semiconductor layer. For instance, the first semiconductor layer 11 may include an N-type semiconductor layer which may include one or more semiconductor material of In—AlGaN, GaN, AlGaN, InGaN, AlN, and InN and may be doped with a first conductive dopant such as Si, Ge, Sn, or a combination thereof. However, the material forming the first semiconductor layer 11 is not limited thereto, and the first semiconductor layer 11 may be formed of various other materials.

The active layer 12 may be disposed on the first semiconductor layer 11 and have a single-quantum well structure or a multi-quantum well structure. The location of the active layer 12 may be changed in various ways depending on the type of the light emitting element LD.

A cladding layer (not shown) doped with a conductive dopant may be selectively formed on and/or under the active layer 12. For example, the cladding layer may be formed of an ALGaN layer or an InALGaN layer. In an embodiment, a material such as AlGaN or InAlGaN may be used to form the active layer 12, and various other materials may be used to form the active layer 12.

The second semiconductor layer 13 may be disposed on the active layer 12 and include a semiconductor layer having a type different from that of the first semiconductor layer 11. For example, the second semiconductor layer 13 may include a P-type semiconductor layer. For instance, the second semiconductor layer 13 may include a P-type semiconductor layer which includes one or more semiconductor material of InAlGaN, GaN, AlGaN, InGaN, AlN, and InN, and may be doped with a second conductive dopant such as Mg. However, the material for forming the second semiconductor layer 13 is not limited thereto, and the second semiconductor layer 13 may be formed of various other materials.

If a voltage equal to or greater than a threshold voltage is applied to each of the opposite ends of the light emitting element LD, the light emitting element LD may emit light by coupling of electron-hole pairs in the active layer 12. Since light emission of the light emitting element LD can be controlled based on the foregoing principle, the light emitting element LD may be used as a light source of various light emitting devices as well as a pixel of the display device.

The light emitting element LD may further include an insulating film INF provided on a surface of the light emitting element LD. The insulating film INF may be formed on the surface of the light emitting element LD to enclose an outer circumferential surface of at least the active layer 12, and may further enclose an area of each of the first and second semiconductor layers 11 and 13.

In an embodiment, the insulating film INF may allow the opposite ends of the light emitting element LD that have different polarities to be exposed to the outside. For example, the insulating film INF may allow an end of each of the first and second semiconductor layers 11 and 13 disposed on the first and second ends EP1 and EP2 of the light emitting element LD to be exposed. In an embodiment, the insulating film INF may allow a side portion of each of the first and second semiconductor layers 11 and 13 adjacent to the first and second ends EP1 and EP2 of the light emitting element LD having different polarities to be exposed.

In an embodiment, the insulating film INF may have a single-layer structure or a multi-layer structure (e.g., a double-layer structure formed of aluminum oxide (AlOx) and silicon oxide (SiOx)) including at least one insulating material among silicon oxide (SiOx), silicon nitride (SiNx), silicon oxynitride (SiOxNy), aluminum oxide (AlOx), and titanium oxide (TiOx). However, the disclosure is not limited thereto. In an embodiment, the insulating film INF may be omitted.

In the case where the insulating film INF is provided to cover the surface of the light emitting element LD, particularly, an outer circumferential surface of the active layer 12, the active layer 12 may be prevented from short-circuiting with a first pixel electrode or a second pixel electrode to be described below. Consequently, the electrical stability of the light emitting element LD may be secured.

If the insulating film INF is provided on the surface of the light emitting element LD, occurrence of a defect on the surface of the light emitting element LD may be minimized, whereby the lifetime and efficiency of the light emitting element LD may be improved. Even in the case where multiple light emitting elements LD are disposed adjacent to each other, an undesired short-circuit may be prevented from occurring between the light emitting elements LD.

In an embodiment, the light emitting element LD may further include an additional component as well as the first semiconductor layer 11, the active layer 12, the second semiconductor layer 13, and/or the insulating film INF that may enclose the first semiconductor layer 11, the active layer 12, and/or the second semiconductor layer 13. For example, the light emitting element LD may further include at least one fluorescent layer, at least one active layer, at least one semiconductor layer and/or at least one electrode layer disposed on an end of the first semiconductor layer 11, the active layer 12, and/or the second semiconductor layer 13. For example, a contact electrode layer may be disposed on each of the first and second ends EP1 and EP2 of the light emitting element LD. Although FIGS. 1 and 2 illustrate a column-type light emitting element LD, the type, the structure, and/or the shape of the light emitting element LD may be changed in various ways. For example, the light emitting element LD may be formed of a core-shell structure having a polypyramid shape.

A light emitting device including the light emitting element LD described above may be used not only in a display device but also in various devices which may require a light source. For instance, multiple light emitting elements LD may be disposed in each pixel of a display panel, so that the light emitting elements LD may be used as a light source of the pixel. However, the application field of the light emitting element LD is not limited to the above-mentioned examples. For example, the light emitting element LD may also be used in other types of devices such as a lighting device, which may require a light source.

Figure 3:
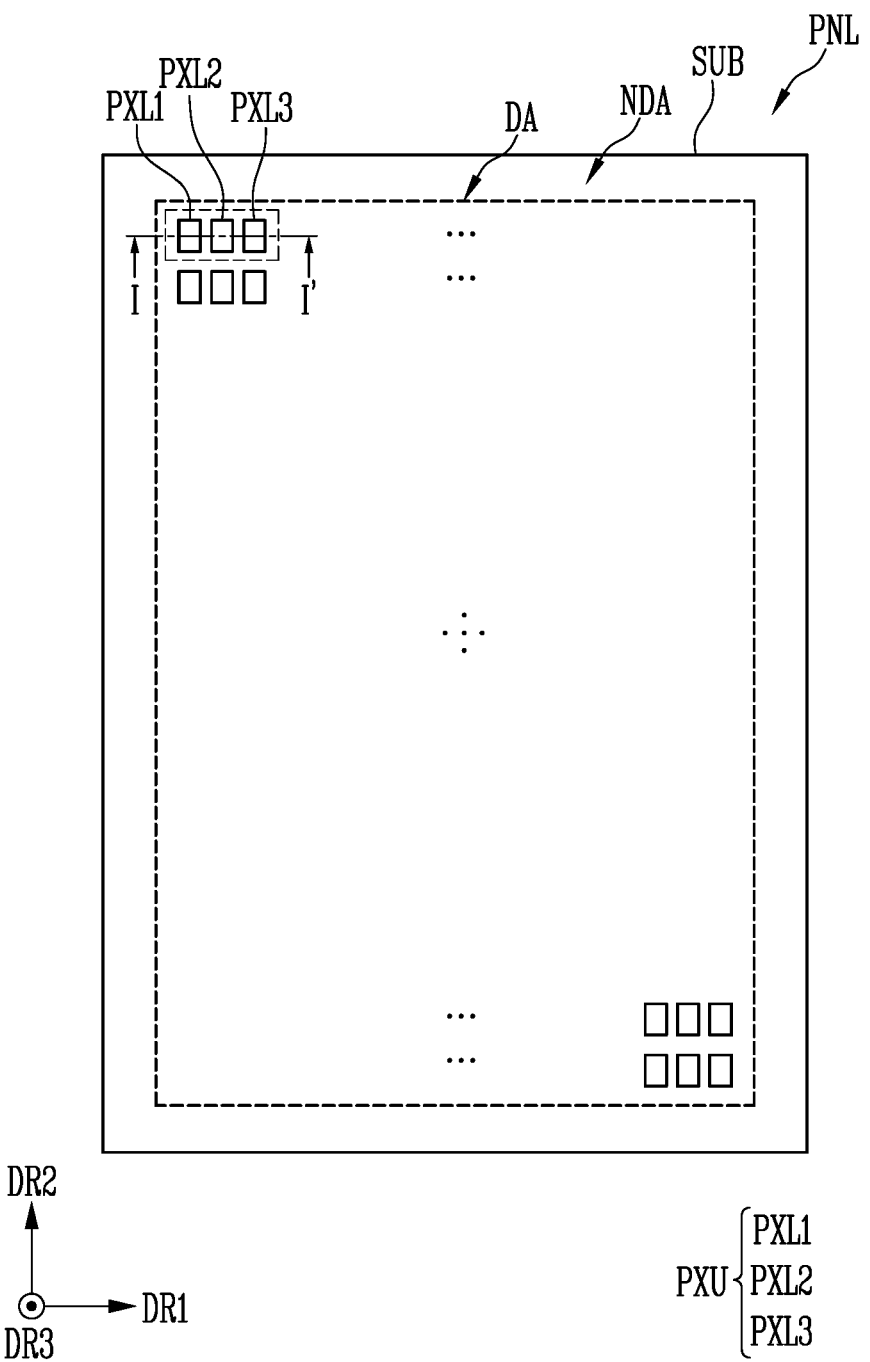
FIG. 3 is a schematic plan view illustrating a display device in accordance with an embodiment of the disclosure.

FIG. 3 is a schematic plan view illustrating a display device in accordance with an embodiment of the disclosure.

FIG. 3 illustrates a display device, particularly, a display panel PNL that may be provided in the display device, as an example of an electronic device which may use, as a light source, the light emitting element LD described in the embodiments of FIGS. 1 and 2.

Each pixel part PXU of the display panel PNL and each pixel for forming the pixel part PXU may include at least one light emitting element LD. For the sake of explanation, FIG. 3 simply illustrates the structure of the display panel PNL in accordance with an embodiment, focused on a display area DA. In some embodiments, although not illustrated, at least one driving circuit (e.g., at least one of a scan driver and a data driver), lines, and/or pads may be further provided on the display panel PNL.

Referring to FIG. 3, the display panel PNL may include a substrate SUB, and a pixel part PXU disposed on the substrate SUB. The pixel part PXU may include a first pixel PXL1, a second pixel PXL2, and/or a third pixel PXL3. Hereinafter, the term "pixel PXL" or "pixels PXL" will be used to collectively designate any pixel or two or more pixels among the first pixel PXL1, the second pixel PXL2, and the third pixel PXL3.

The substrate SUB may form a base of the display panel PNL and be a rigid or flexible substrate or film. For example, the substrate SUB may be a rigid substrate made of glass or reinforced glass, a flexible substrate (or a thin film) formed of plastic or metal, or at least one insulating layer. The material and/or properties of the substrate SUB is not particularly limited, or a combination thereof.

In an embodiment, the substrate SUB may be substantially transparent. Here, the words "substantially transparent" may mean that light can pass through the substrate SUB at a transmissivity or more. In an embodiment, the substrate SUB may be translucent or opaque. Furthermore, the substrate SUB may include reflective material in some embodiments.

The display panel PNL and the substrate SUB for forming the display panel PNL may include a display area DA for displaying an image, and a non-display area NDA formed in an area other than the display area DA.

The pixels PXL may be disposed in the display area DA. Various lines, pads, and/or internal circuits which may be electrically connected to the pixels PXL of the display area DA may be disposed in the non-display area NDA. The pixels PXL may be regularly arranged according to a stripe or Pentile® arrangement structure. The arrangement structure of the pixels PXL is not limited thereto, and the pixels PXL may be arranged on the display area DA in various structures and/or schemes.

In an embodiment, two or more kinds of pixels PXL which emit different colors of light may be disposed on the display area DA. For example, first pixels PXL1 that emits a first color of light, second pixels PXL2 that emits a second color of light, and a third pixels PXL3 that emits a third color of light may be arranged on the display area DA. At least one first pixel PXL1, at least one second pixel PXL2, and at least one third pixel PXL3 that may be disposed adjacent to each other may form a pixel part PXU which may emit light having various colors. For example, each of the first to third pixels PXL1, PXL2, and PXL3 may be a sub-pixel that emits a color of light. In an embodiment, the first pixel PXL1 may be a red pixel which emits red light, a second pixel PXL2 may be a green pixel which emits green light, and a third pixel PXL3 may be a blue pixel which emits blue light. However, the disclosure is not limited thereto.

In an embodiment, the first pixel PXL1, the second pixel PXL2, and the third pixel PXL3 may include, as light sources, a light emitting element related to the first color, a light emitting element related to the second color, and a light emitting element related to the third color, so that the pixels may respectively emit the first color of light, the second color of light, and the third color of light. In an embodiment, the first pixel PXL1, the second pixel PXL2, and the third pixel PXL3 may respectively include light emitting elements that emit a same color of light, and color filters and color conversion layers having different colors may be disposed on the respective light emitting elements so that the pixels may respectively emit the first color of light, the second color of light, and the third color of light. However, the colors, the types, and/or the number of pixels PXL that form each pixel part PXU are not particularly limited. In other words, the color of light to be emitted from each pixel PXL may be changed in various ways.

The pixel PXL may include at least one light source which may be driven by a control signal (e.g., a scan signal and a data signal) and/or a power supply (e.g., a first power supply and a second power supply). In an embodiment, the light source may include at least one light emitting element LD in accordance with any of the embodiments of FIGS. 1 and 2, e.g., subminiature column-type light emitting elements LD having a small size corresponding to a range from the nanometer scale to the micrometer scale. However, the disclosure is not limited thereto, and different types of light emitting elements LD may be used as a light source of the pixel PXL.

In an embodiment, each pixel PXL may be formed of an active pixel. However, the types, structures, and/or driving schemes of the pixels PXL capable of being applied to the display device are not particularly limited. For example, each pixel PXL may have a same structure as that of a pixel for passive or active light emitting display devices which have various structures and/or may be operated in various driving schemes.

Figure 4:
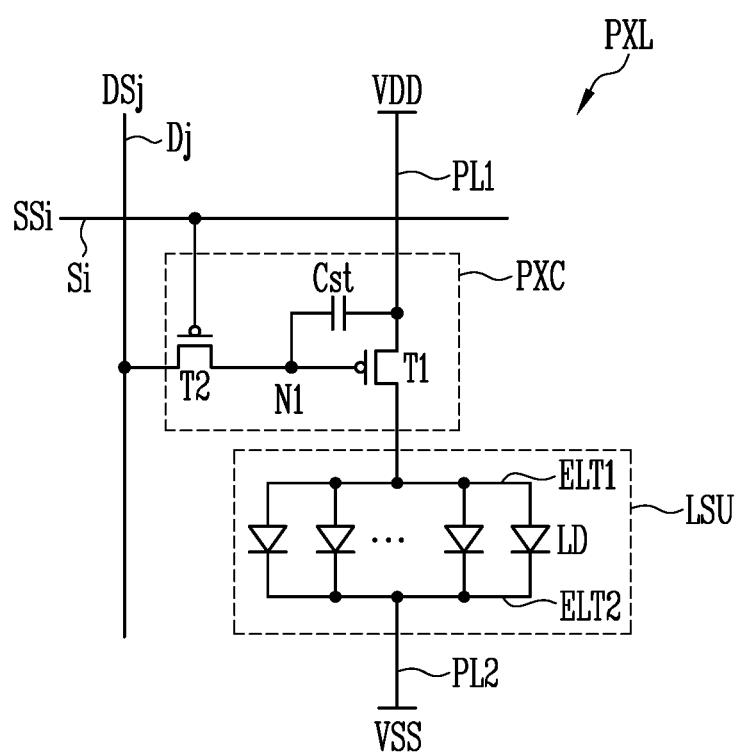
FIGS. 4 to 6 are schematic circuit diagrams illustrating pixels in accordance with respective embodiments.
Figure 5:
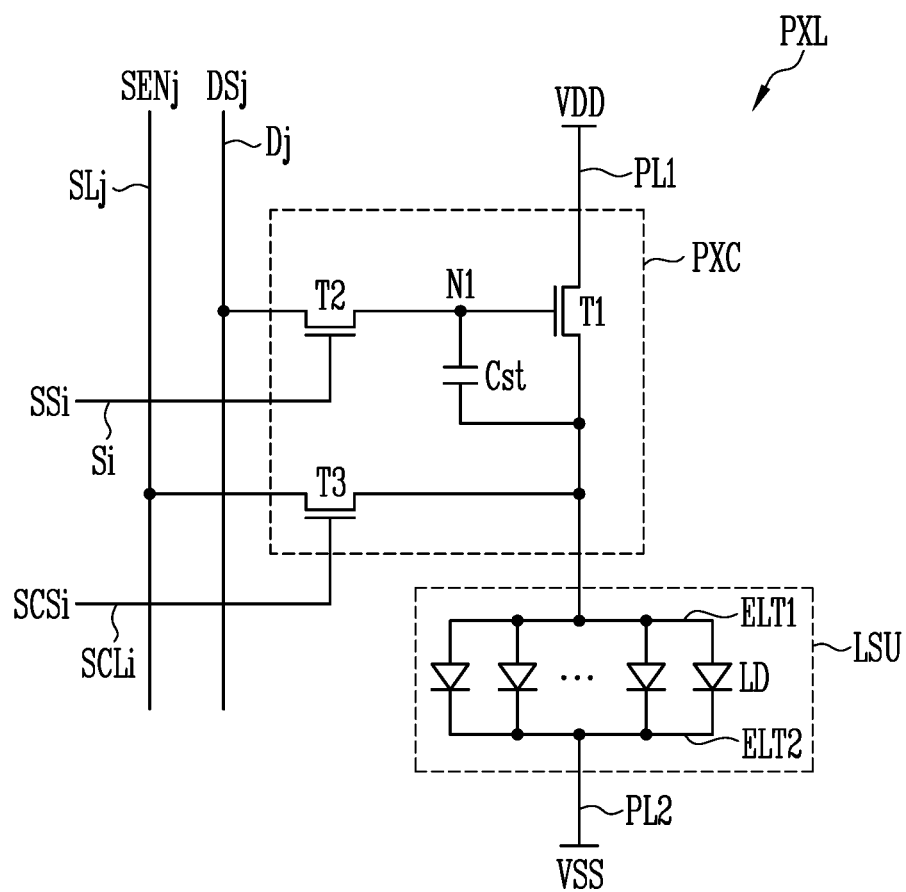
Figure 6:
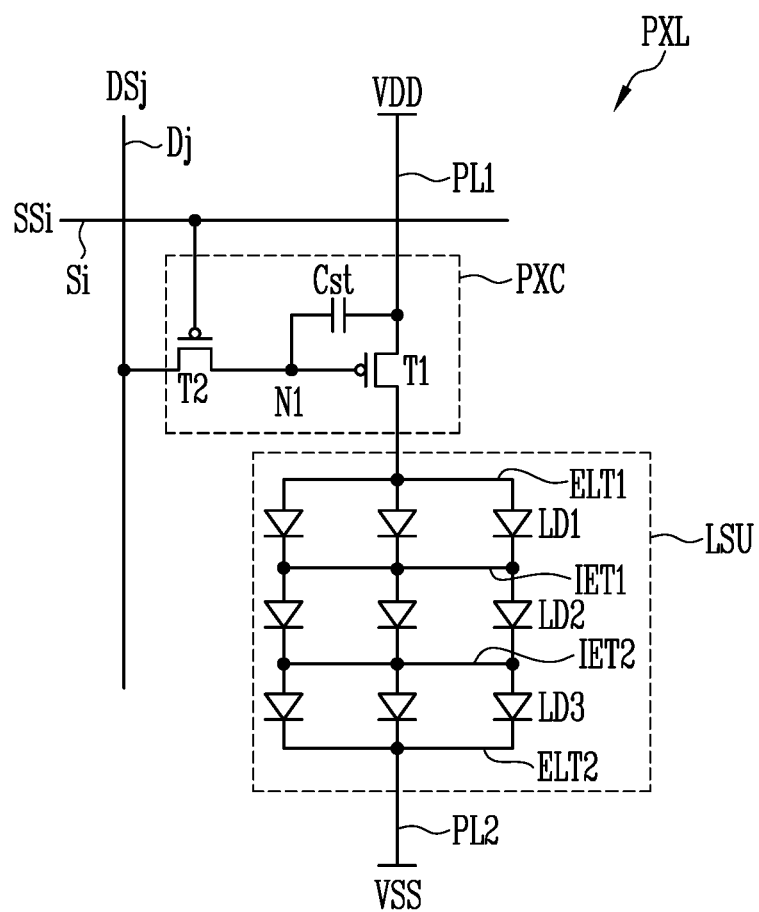

FIGS. 4 to 6 are schematic circuit diagrams illustrating pixels in accordance with respective embodiments. For example, FIGS. 4 to 6 illustrate an embodiment of the pixel PXL which can be applied to an active display device. However, the types of the pixel PXL and the display device are not limited thereto.

In an embodiment, the pixel PXL illustrated in FIGS. 4 to 6 may be any of the first pixel PXL1, the second pixel PXL2, and the third pixel PXL3 which may be provided on the display panel PNL of FIG. 3. The first pixel PXL1, the second pixel PXL2, and the third pixel PXL3 may have substantially a same or similar structure.

Referring to FIG. 4, the pixel PXL may include a light source part LSU that generates light having a luminance corresponding to a data signal, and a pixel circuit PXC that drives the light source part LSU.

The light source part LSU may include at least one light emitting element LD electrically connected between the first power supply VDD and the second power supply VSS. For example, the light source part LSU may include a first electrode ELT1 (referred also to as "first pixel electrode" or "first alignment electrode") electrically connected to the first power supply VDD via the pixel circuit PXC and the first power line PL1, a second electrode ELT2 (referred also to as "second pixel electrode" or "second alignment electrode") electrically connected to the second power supply VSS through the second power line PL2, and light emitting elements LD electrically connected in a same direction between the first and second electrodes ELT1 and ELT2. In an embodiment, the first electrode ELT1 may be an anode electrode, and the second electrode ELT2 may be a cathode electrode.

Each of the light emitting elements LD may include a first end (e.g., a P-type end) electrically connected to the first power supply VDD through the first electrode ELT1 and/or the pixel circuit PXC, and a second end (e.g., an N-type end) electrically connected to the second power supply VSS through the second electrode ELT2. In other words, the light emitting elements LD may be electrically connected in parallel between the first electrode ELT1 and the second electrode ELT2 in a forward direction. Each of the light emitting elements LD electrically connected in a forward direction between the first power supply VDD and the second power supply VSS may form a valid light source. The valid light sources may form the light source part LSU of the pixel PXL.

The first power supply VDD and the second power supply VSS may have different potentials to allow the light emitting elements LD to emit light. For example, the first power supply VDD may be set as a high-potential power supply, and the second power supply VSS may be set as a low-potential power supply. Here, a difference in potential between the first power supply VDD and the second power supply VSS may be set to a threshold voltage of the light emitting elements LD or more during at least an emission period of the pixel PXL.

The first ends (e.g., P-type ends) of the light emitting elements LD that form each light source part LSU may be electrically connected in common to the pixel circuit PXC through an electrode of the light source part LSU (e.g., the first electrode ELT1 of each pixel PXL), and be electrically connected to the first power supply VDD through the pixel circuit PXC and the first power line PL1. The second ends (e.g., N-type ends) of the light emitting elements LD may be electrically connected in common to the second power supply VSS through the second power line PL2 and an electrode of the light source part LSU (e.g., the second electrode ELT2 of each pixel PXL).

The light emitting elements LD may emit light having a luminance corresponding to driving current supplied thereto through the corresponding pixel circuit PXC. For example, during each frame period, the pixel circuit PXC may supply driving current corresponding to a grayscale value to be expressed in the corresponding frame to the light source part LSU. The driving current supplied to the light source part LSU may be divided into the light emitting elements LD electrically connected in the forward direction. Hence, each of the light emitting elements LD may emit light having a luminance corresponding to current applied thereto, so that the light source part LSU may emit light having a luminance corresponding to the driving current.

The pixel circuit PXC may be electrically connected between the first power supply VDD and the first electrode ELT1. The pixel circuit PXC may be electrically connected to a scan line Si and a data line Dj of the corresponding pixel PXL. For example, if the pixel PXL is disposed on an i-th (i may be a natural number) horizontal line (row) and a j-th (j may be a natural number) vertical line (column) of the display area DA, the pixel circuit PXC of the pixel PXL may be electrically connected to an i-th scan line Si and a j-th data line Dj of the display area DA.

In an embodiment, the pixel circuit PXC may include transistors and at least one capacitor. For example, the pixel circuit PXC may include a first transistor T1, a second transistor T2, and a storage capacitor Cst.

The first transistor T1 may be electrically connected between the first power supply VDD and the light source part LSU. For example, a first electrode (e.g., a source electrode) of the first transistor T1 may be electrically connected to the first power supply VDD, and a second electrode (e.g., a drain electrode) of the first transistor T1 may be electrically connected to the first electrode ELT1. A gate electrode of the first transistor T1 may be electrically connected to a first node N1. The first transistor T1 may control driving current to be supplied to the light source part LSU in response to the voltage of the first node N1. In other words, the first transistor T1 may be a driving transistor that controls the driving current of the pixel PXL.

The second transistor T2 may be electrically connected between the data line Dj and the first node N1. For example, a first electrode (e.g., a source electrode) of the second transistor T2 may be electrically connected to the data line Dj, and a second electrode (e.g., a drain electrode) of the second transistor T2 may be electrically connected to the first node N1. A gate electrode of the second transistor T2 may be electrically connected to the scan line Si. In case that a scan signal having a gate-on voltage (e.g., a low level voltage) is supplied from the scan line Si, the second transistor T2 may be turned on to electrically couple the first node N1 to the data line Dj.

During each frame period, a data signal DSj of a corresponding frame may be supplied to the data line Dj, and the data signal DSj may be transmitted to the first node N1 through the second transistor T2 that may be turned on during a period in which the scan signal SSi having the gate-on voltage may be supplied. In other words, the second transistor T2 may be a switching transistor that transmits each data signal DSj to the interior of the pixel PXL.

An electrode of the storage capacitor Cst may be electrically connected to the first power supply VDD, and another electrode thereof may be electrically connected to the first node N1. The storage capacitor Cst may be charged with a voltage corresponding to a data signal DSj to be supplied to the first node N1 during each frame period.

Although FIG. 4 illustrates that the transistors included in the pixel circuit PXC, e.g., both the first and second transistors T1 and T2, may be P-type transistors, the disclosure is not limited thereto. At least one of the first and second transistors T1 and T2 may be changed to an N-type transistor. The pixel circuit PXC may be formed of a pixel circuit which may have various structures and/or be operated by various driving schemes.

Referring to FIG. 5, the pixel circuit PXC may be further electrically connected to a sensing control line SCLi and a sensing line SLj For example, the pixel circuit PXC of the pixel PXL disposed on the i-th horizontal line and the j-th vertical line of the display area DA may be electrically connected to an i-th sensing control line SCLi and a j-th sensing line SLj of the display area DA. The pixel circuit PXC may further include a third transistor T3. In an embodiment, the sensing line SLj may be omitted, and characteristics of the pixel PXL may be detected by detecting a sensing signal SENj through the data line Dj of the corresponding pixel PXL (or an adjacent pixel).

The third transistor T3 may be electrically connected between the first transistor T1 and the sensing line SLj. For example, a first electrode of the third transistor T3 may be electrically connected to an electrode (e.g., a source electrode) of the first transistor T1 electrically connected to the first electrode ELT1, and a second electrode of the third transistor T3 may be electrically connected to the sensing line SLj. In the case where the sensing line SLj is omitted, the second electrode of the third transistor T3 may be electrically connected to the data line Dj.

A gate electrode of the third transistor T3 may be electrically connected to the sensing control line SCLi. In the case where the sensing control line SCLi is omitted, the gate electrode of the third transistor T3 may be electrically connected to the scan line Si. The third transistor T3 may be turned on by a sensing control signal SCSi having a gate-on voltage (e.g., a high level voltage) supplied to the sensing control line SCLi during a sensing period, and thus electrically couple the sensing line SLj with the first transistor T1.

In an embodiment, the sensing period may be a period in which characteristics of each of the pixels PXL disposed in the display area DA (e.g., a threshold voltage, etc. of the first transistor T1) may be extracted. During the sensing period, the first transistor T1 may be turned on by supplying a reference voltage capable of turning on the first transistor T1 to the first node N1 through the data line Dj and the second transistor T2, or coupling each pixel PXL to a current source or the like. Furthermore, the third transistor T3 may be turned on by supplying a sensing control signal SCSi having a gate-on voltage to the third transistor T3, so that the first transistor T1 can be electrically connected to the sensing line SLj. Thereafter, a sensing signal SENj may be obtained through the sensing line SLj, and characteristics of each pixel PXL including the threshold voltage, etc. of the first transistor T1 may be detected using the sensing signal SENj. Information about the characteristics of each pixel PXL may be used to convert image data such that a deviation in characteristic between pixels PXL disposed in the display area DA can be compensated for.

Although FIG. 5 illustrates an embodiment where the first, second, and third transistors T1, T2, and T3 may be N-type transistors, the disclosure is not limited thereto. For example, at least one of the first, second, and third transistors T1, T2, and T3 may be changed to a P-type transistor.

Furthermore, although FIGS. 4 and 5 illustrate an embodiment in which valid light sources, e.g., light emitting elements LD, for forming each light source part LSU may be electrically connected in parallel to each other, the disclosure is not limited thereto. For example, as illustrated in FIG. 6, the light source part LSU of each pixel PXL may have an at least two-stage serial structure. In the description of embodiments of FIG. 6, like reference numerals are used to designate components similar or equal to those of the embodiments of FIGS. 4 and 5 (e.g., the pixel circuit PXC), and detailed explanation thereof will be omitted.

Referring to FIG. 6, the light source part LSU may include at least two light emitting elements electrically connected in series to each other. For example, the light source part LSU may include a first light emitting element LD1, a second light emitting element LD2, and a third light emitting element LD3 which may be electrically connected in series in a forward direction between the first power supply VDD and the second power supply VSS. The first, second, and third light emitting elements LD1, LD2, and LD3 may form each valid light source.

Hereinafter, in case that a specific light emitting element among the first, second, and third light emitting elements LD1, LD2, and LD3 is designated, the corresponding light emitting element will be referred to as "first light emitting element LD1", "second light emitting element LD2", or "third light emitting element LD3". The term "light emitting element LD" or "light emitting elements LD" will be used to arbitrarily designate at least one light emitting element of the first, second, and the third light emitting elements LD1, LD2, and LD3 or collectively designate the first, second, and third light emitting elements LD1, LD2, and LD3.

A first end (e.g., a P-type end) of the first light emitting element LD1 may be electrically connected to the first power supply VDD via a first electrode (e.g., a first pixel electrode) ELT1 of the light source part LSU, etc. A second end (e.g., an N-type end) of the first light emitting element LD1 may be electrically connected to a first end (e.g., a P-type end) of the second light emitting element LD2 through a first intermediate electrode IET1.

The first end of the second light emitting element LD2 may be electrically connected to the second end of the first light emitting element LD1. A second end (e.g., an N-type end) of the second light emitting element LD2 may be electrically connected to a first end (e.g., a P-type end) of the third light emitting element LD3 through a second intermediate electrode IET2.

The first end of the third light emitting element LD3 may be electrically connected to the second end of the second light emitting element LD2. A second end (e.g., an N-type end) of the third light emitting element LD3 may be electrically connected to the second power supply VSS via a second electrode (e.g., a second pixel electrode) ELT2 of the light source part LSU, etc. In this way, the first, second, and the third light emitting elements LD1, LD2, and LD3 may be successively connected in series between the first and second electrodes ELT1 and ELT2 of the light source part LSU.

Although FIG. 6 illustrates an embodiment in which the light emitting elements LD may be electrically connected in a serial structure, the disclosure is not limited thereto. Two light emitting elements LD may be electrically connected in a two-stage serial structure, or four or more light emitting elements LD may be electrically connected in a four- or more-stage serial structure.

In case that it is assumed that a same luminance is expressed using light emitting elements LD having the same conditions (e.g., a same size and/or number), in a light source part LSU having a structure in which light emitting elements LD may be electrically connected in series, the voltage to be applied between the first and second electrodes ELT1 and ELT2 may be increased, and the amount of driving current flowing through the light source part LSU may be reduced, compared to a light source part LSU having a structure in which light emitting elements LD may be electrically connected in parallel. Therefore, in the case where the light source part LSU of each pixel PXL is formed using a serial structure, panel current flowing through the display panel PNL may be reduced.

As described in the foregoing embodiments, each light source part LSU may include light emitting elements LD which may be electrically connected in a forward direction between the first and second power supplies VDD and VSS and form respective valid light sources. Furthermore, the connection structure between the light emitting elements LD may be changed in various ways depending on embodiments. For example, the light emitting elements LD may be electrically connected only in series or parallel to each other, or in a series/parallel combination structure.

Hereinafter, a pixel PXL included in a display device in accordance with an embodiment will be described with reference to FIG. 7.

Figure 7:
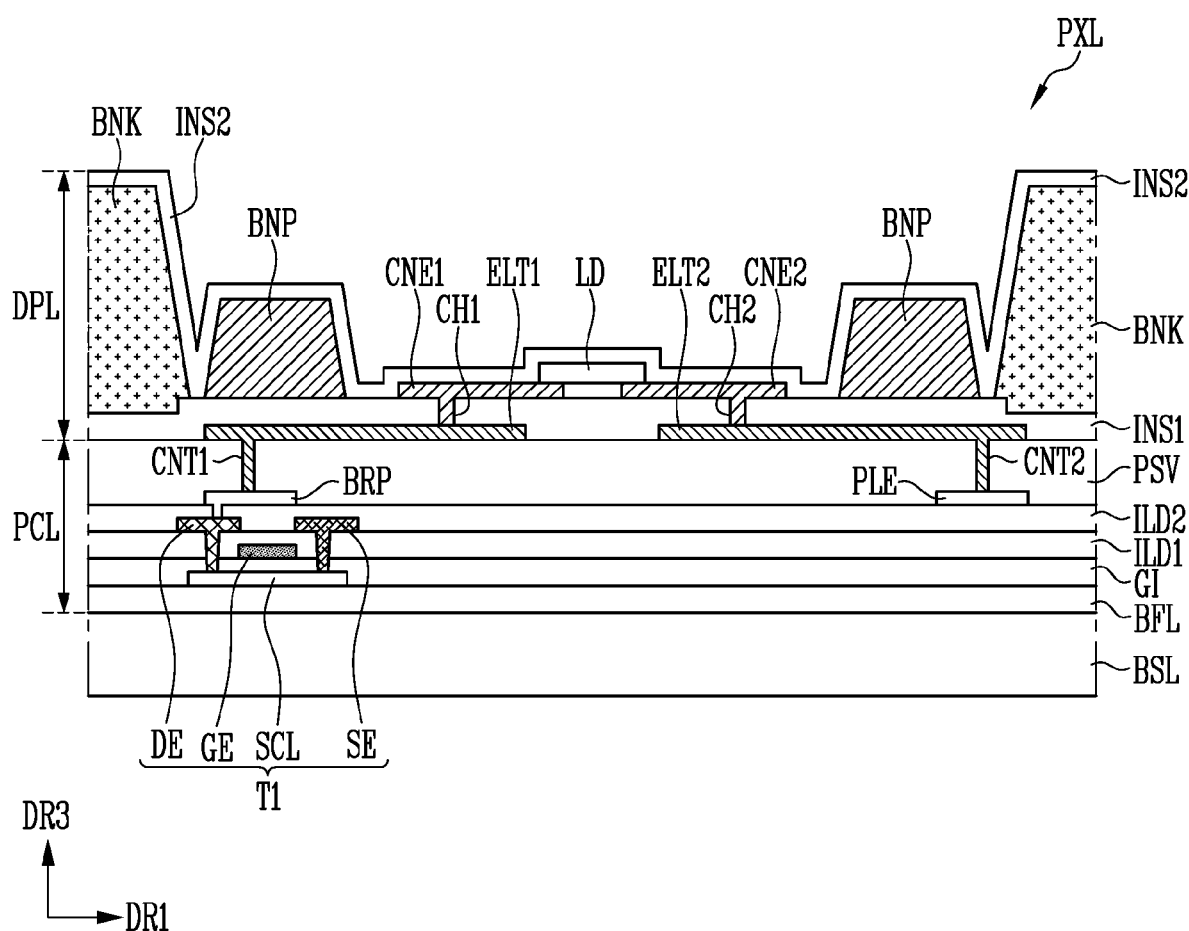
FIG. 7 is a schematic sectional view illustrating a pixel included in the display device in accordance with an embodiment of the disclosure.

FIG. 7 is a schematic sectional view illustrating the pixel included in the display device in accordance with an embodiment of the disclosure.

Referring to FIG. 7, the pixel PXL may include a base layer BSL, a pixel circuit layer PCL, and a display element layer DPL. For the sake of explanation, descriptions with reference to FIGS. 7 and 8 may be based on the configuration of a transistor corresponding to the first transistor T1 among the transistors illustrated in FIGS. 4 to 6.

The base layer BSL may be a rigid or flexible substrate. The base layer BSL may be the substrate SUB described above with reference to FIG. 3. In an embodiment, the base layer BSL may include rigid material or flexible material. For instance, the flexible material may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, cellulose triacetate, and cellulose acetate propionate. However, the material of the base layer BSL that can be applied to embodiments of the disclosure is not limited to a particular example.

The pixel circuit layer PCL may include a buffer layer BFL, a first transistor T1, a gate insulating layer GI, a first interlayer insulating layer ILD1, a second interlayer insulating layer ILD2, a bridge pattern BRP, a power line PLE, a first contactor CNT1, a second contactor CNT2, and a passivation layer PSV.

The buffer layer BFL may be disposed on the base layer BSL. The buffer layer BFL may prevent impurities from diffusing from the outside. The buffer layer BFL may include at least one of silicon nitride (SiNx), silicon oxide (SiOx), silicon oxynitride (SiOxNy), and metal oxide such as aluminum oxide (AlOx).

The first transistor T1 may be a thin-film transistor. For example, the first transistor T1 may be a driving transistor of thin-film transistors. The first transistor T1 may include a semiconductor layer SCL, a gate electrode GE, a source electrode SE, and a drain electrode DE.

The semiconductor layer SCL may be disposed on the buffer layer BFL. The semiconductor layer SCL may include at least one of polysilicon, amorphous silicon, and an oxide semiconductor.

The semiconductor layer SCL may include a first contact area which comes into contact with the source electrode SE, and a second contact area which comes into contact with the drain electrode DE.

Each of the first contact area and the second contact area may be a semiconductor pattern doped with impurities. An area between the first contact area and the second contact area may be a channel area. The channel area may be an intrinsic semiconductor pattern which may be not doped with impurities.

The gate insulating layer GI may be provided on the semiconductor layer SCL. The gate insulating layer GI may include inorganic material. For example, the gate insulating layer GI may include at least one of silicon nitride (SiNx), silicon oxide (SiOx), silicon oxynitride (SiOxNy), and aluminum oxide (AlOx). In an embodiment, the gate insulating layer GI may include organic material.

The gate electrode GE may be formed on the gate insulating layer GI. The position of the gate electrode GE may correspond to the position of the channel area of the semiconductor layer SCL. For example, the gate electrode GE may be disposed on the channel area of the semiconductor layer SCL with the gate insulating layer GI interposed therebetween.

The first interlayer insulating layer ILD1 may be disposed on the gate electrode GE. The first interlayer insulating layer ILD1 may include at least one of silicon nitride (SiNx), silicon oxide (SiOx), silicon oxynitride (SiOxNy), and aluminum oxide (AlOx), in a same manner as that of the gate insulating layer GI.

The source electrode SE and the drain electrode DE may be disposed on the first interlayer insulating layer ILD1. The source electrode SE may come into contact with the first contact area of the semiconductor layer SCL through the gate insulating layer GI and the first interlayer insulating layer ILD1. The drain electrode DE may come into contact with the second contact area of the semiconductor layer SCL through the gate insulating layer GI and the first interlayer insulating layer ILD1.

The second interlayer insulating layer ILD2 may be disposed on the source electrode SE and the drain electrode DE. The second interlayer insulating layer ILD2 may include inorganic material in a same manner as that of the first interlayer insulating layer ILD1 and the gate insulating layer GI. The inorganic material may include materials, for example, at least one of silicon nitride (SiNx), silicon oxide (SiOx), silicon oxynitride (SiOxNy), and aluminum oxide (AlOx). In an embodiment, the second interlayer insulating layer ILD2 may include organic material.

The bridge pattern BRP may be disposed on the second interlayer insulating layer ILD2. The bridge pattern BRP may be electrically connected to the drain electrode DE through a contact hole passing through the second interlayer insulating layer ILD2.

The power line PLE may be disposed on the second interlayer insulating layer ILD2. The power line PLE may be applied with power from the second power line PL2 described above with reference to FIGS. 4 to 6.

The passivation layer PSV may be disposed on the second interlayer insulating layer ILD2. The passivation layer PSV may cover the bridge pattern BRP and the power line PLE.

The passivation layer PSV may be provided in the form of an organic insulating layer, an inorganic insulating layer, or a structure including the organic insulating layer disposed on the inorganic insulating layer.

The passivation layer PSV may include the first contactor CNT1 electrically connected to an area of the bridge pattern BRP, and the second contactor CNT2 electrically connected to an area of the power line PLE.

The display element layer DPL may include a first electrode ELT1, a second electrode ELT2, a first insulating layer INS1, a first contact hole CH1, a second contact hole CH2, a bank pattern BNP, a first contact electrode CNE1, a second electrode CNE2, a light emitting element LD, a bank BNK, and a second insulating layer INS2.

The first electrode ELT1 may be disposed on the passivation layer PSV. The first electrode ELT1 and the second electrode ELT2 may be formed on a same layer. The first electrode ELT1 may be electrically connected with the first contactor CNT1 and be a path along which a voltage may be applied from the first power supply VDD.

The second electrode ELT2 may be disposed on the passivation layer PSV. The second electrode ELT2 and the first electrode ELT1 may be formed on a same layer. The second electrode ELT2 may be electrically connected with the second contactor CNT2 and be a path along which a voltage may be applied from the second power supply VSS.

The first electrode ELT1 and the second electrode ELT2 may reflect light emitted from the light emitting element LD in a display direction of the display device so as to improve the emission efficiency of the light emitting element LD. Here, the display direction may refer to a third direction DR3.

The first insulating layer INS1 may be disposed on the passivation layer PSV. The first insulating layer INS1 may include at least one of silicon nitride (SiNx), silicon oxide (SiOx), silicon oxynitride (SiOxNy), and aluminum oxide (AlOx), in a same manner as that of the second interlayer insulating layer ILD2.

The first insulating layer INS1 may be disposed on the first electrode ELT1 and the second ELT2 so as to stabilize electrical connection and reduce external effects.

The bank BNK may be a structure which defines an emission area (refer to 'EMA' of FIG. 9) of the pixel PXL. The emission area EMA may refer to an area in which light may be emitted from the light emitting element LD. For example, the bank BNK may be disposed, to enclose the light emitting element LD of the pixel PXL, in a boundary area between the light emitting element LD and an adjacent light emitting element LD.

The bank BNK may include organic material or inorganic material.

The first contact electrode CNE1 and the second contact electrode CNE2 may be disposed on the first insulating layer INS1. The first contact electrode CNE1 and the second contact electrode CNE2 may be disposed between the pixel circuit layer PCL and the light emitting element LD. The first contact electrode CNE1 and the second contact electrode CNE2 may be disposed between the base layer BSL and the light emitting element LD. The first contact electrode CNE1 may be electrically connected to the first electrode ELT1 through the first contact hole CH1 formed in the first insulating layer INS1. The second contact electrode CNE2 may be electrically connected to the second electrode ELT2 through the second contact hole CH2 formed in the first insulating layer INS1.

An electrical signal provided through the first electrode ELT1 may be provided to the light emitting element LD through the first contact electrode CNE1. The light emitting element LD may emit light based on the provided electrical signal. An electrical signal provided through the second electrode ELT2 may be provided to the light emitting element LD through the second contact electrode CNE2.

The bank pattern BNP may have a shape extending (e.g., protruding) upward (for example, the upward direction may refer to the third direction DR3). The bank pattern BNP may be provided in the form of enclosing the area where the light emitting element LD may be disposed, in a plan view.

The first contact electrode CNE1, the second contact electrode CNE2, and the bank pattern BNP may be formed through a same process. The first contact electrode CNE1, the second contact electrode CNE2, and the bank pattern BNP may be formed through a single etching process. The first contact electrode CNE1, the second contact electrode CNE2, and the bank pattern BNP may be obtained by placing a target layer to be etched and differently etching the target layer by positions.

The first contact electrode CNE1, the second contact electrode CNE2, and the bank pattern BNP may include a same material. Each of the first contact electrode CNE1, the second contact electrode CNE2, and the bank pattern BNP may be formed of a same material. For example, each of the first contact electrode CNE1, the second contact electrode CNE2, and the bank pattern BNP may include transparent conductive material. Particularly, each of the first contact electrode CNE1, the second contact electrode CNE2, and the bank pattern BNP may include a transparent conductive polymer. For example, each of the first contact electrode CNE1, the second contact electrode CNE2, and the bank pattern BNP may be formed of a transparent conductive polymer having a same composition ratio.

The term "transparent" may mean that light can pass through material at a transmissivity or more. The first contact electrode CNE1 and the second contact electrode CNE2 may include transparent conductive material to satisfy the transmissivity, so that light output from the light emitting element LD may pass through the first and second contact electrodes CNE1 and CNE2 and be emitted to the outside.

Detailed descriptions of a process about the bank pattern BNP and the first and second contact electrodes CNE1 and CNE2 and the transparent conductive polymer will be described with reference to FIGS. 10 to 18. Accordingly, duplicative descriptions may be omitted.

The light emitting element LD may be disposed on the first contact electrode CNE1 and the second contact electrode CNE2. An end of the light emitting element LD may come into contact with the first contact electrode CNE1, and another end of the light emitting element LD may come into contact with the second contact electrode CNE2. The light emitting element LD may have a structure described above with reference to FIGS. 1 and 2.

The second insulating layer INS2 may be disposed on the bank BNK, the bank pattern BNP, the first contact electrode CNE1, the second contact electrode CNE2, and the light emitting element LD. The second insulating layer INS2 may include one or more of organic material or inorganic material. The second insulating layer INS2 may protect the components of the display element layer DPL from external effects. In an embodiment, at least a portion of the second insulating layer INS2 may be disposed on a rear surface of the light emitting element LD. The second insulating layer INS2 formed on the rear surface of the light emitting element LD may be charged into space between the first insulating layer INS1 and the light emitting element LD during a process of forming the second insulating layer INS2 on the light emitting element LD.

Hereinafter, a pixel PXL included in a display device in accordance with an embodiment will be described with reference to FIG. 8. Duplicative descriptions may be omitted.

Figure 8:
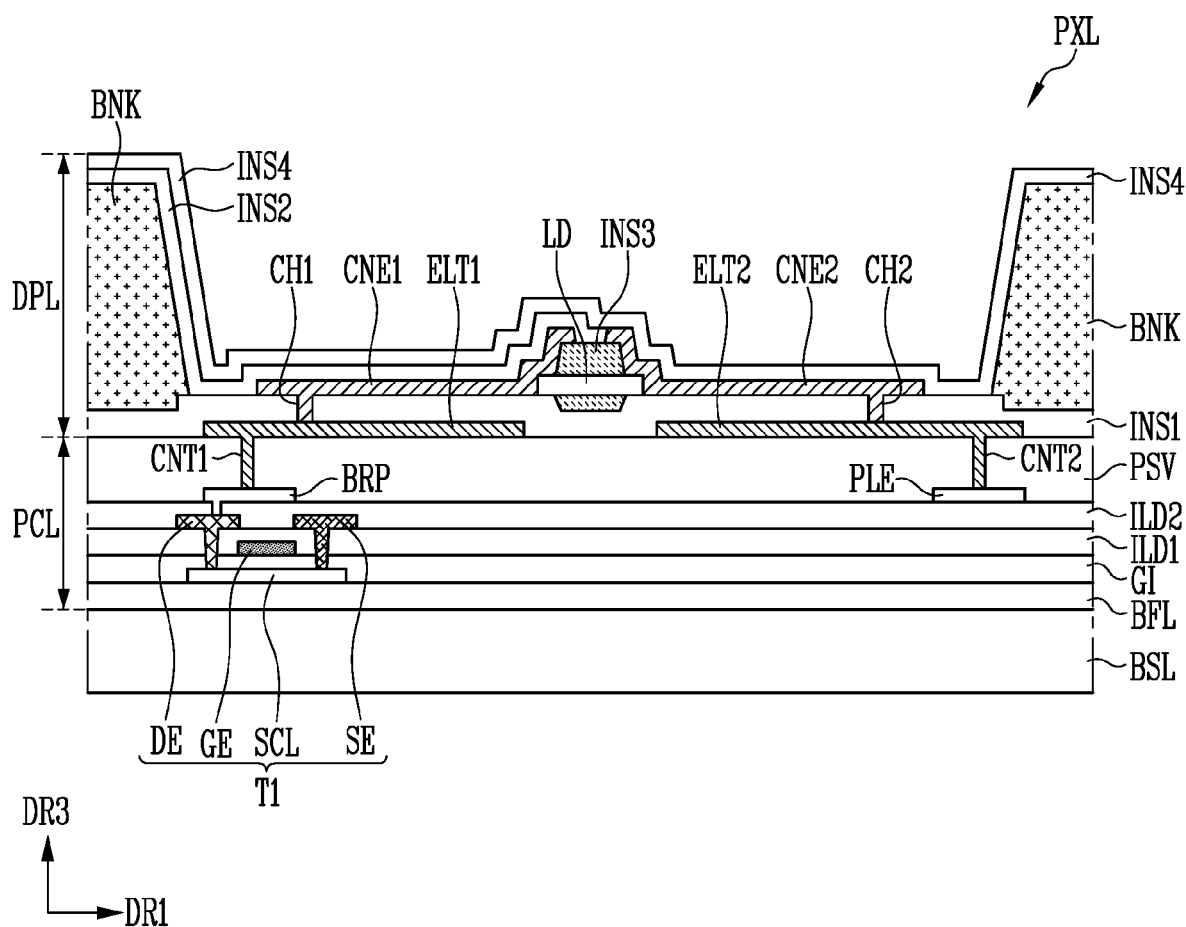
FIG. 8 is a schematic sectional view illustrating a pixel included in the display device in accordance with an embodiment of the disclosure.

FIG. 8 is a schematic sectional view illustrating the pixel PXL included in the display device in accordance with an embodiment of the disclosure.

The pixel PXL included in the display device in accordance with an embodiment may further include a third insulating layer INS3 and a fourth insulating layer INS4, and may not include a bank pattern BNP.

The pixel PXL included in the display device in accordance with the embodiment and the pixel PXL included in the display device in accordance with the foregoing embodiment may differ from each other in position relationship between the light emitting element LD and the first and second contact electrodes CNE1 and CNE2.

Referring to FIG. 8, the light emitting element LD may be disposed on the first insulating layer INS1. For example, the first insulating layer INS1 may have a recess. At least a portion of the light emitting element LD may come into contact with an end formed by the recess, and another portion thereof may come into contact with another end formed by the recess.

The third insulating layer INS3 may be disposed on the light emitting element LD. The third insulating layer INS3 may cover the active layer 12 of the light emitting element LD described above with reference to FIG. 2. At least a portion of the third insulating layer INS3 may be disposed on a rear surface of the light emitting element LD. The third insulating layer INS3 formed on the rear surface of the light emitting element LD may be charged into space between the first insulating layer INS1 and the light emitting element LD during a process of forming the third insulating layer INS3 on the light emitting element LD.

The third insulating layer INS3 may include at least one of organic material or inorganic material. In the case where the third insulating layer INS3 includes organic material, the third insulating layer INS3 may be an organic insulating layer.

At least a portion of each of the first contact electrode CNE1 and the second contact electrode CNE2 may be disposed on the light emitting element LD. The first contact electrode CNE1 and the second contact electrode CNE2 may be electrically connected with the light emitting element LD.

The first contact electrode CNE1 and the second contact electrode CNE2 may include a transparent conductive polymer, in a same manner as that described with reference to FIG. 7.

The second insulating layer INS2 included in the display device in accordance with an embodiment may be disposed on the bank BNK, the first contact electrode CNE1, the third insulating layer INS3, and the light emitting element LD. In other words, in an embodiment, the second insulating layer INS2 may be disposed between the first contact electrode CNE1 and the second contact electrode CNE2. As such, if the second insulating layer INS2 is formed between the first contact electrode CNE1 and the second electrode CNE2, electrical stability between a first end and a second end of the light emitting element LD can be secured. Hence, short-circuit defects may be prevented from occurring between the first end and the second ends of the light emitting element LD.

The fourth insulating layer INS4 may be disposed on the bank BNK, the second insulating layer INS2, and the second contact electrode CNE2. For example, the fourth insulating layer INS4 may cover the outermost periphery of the display element layer DPL and protect the components of the display element layer DPL from external effects.

The fourth insulating layer INS4 may include organic material or inorganic material. For example, the fourth insulating layer INS4 may include one or more of materials that are illustratively listed for the first insulating layer INS1.

Hereinafter, a light controlling layer LCP and an upper substrate UPL provided in a display device in accordance with an embodiment will be described with reference to FIG. 9. For the sake of explanation, repetitive descriptions of detailed structures of the pixel circuit layer PCL and the display element layer DPL will be omitted, and a structure including the light controlling layer LCP will be described in detail.

Figure 9:
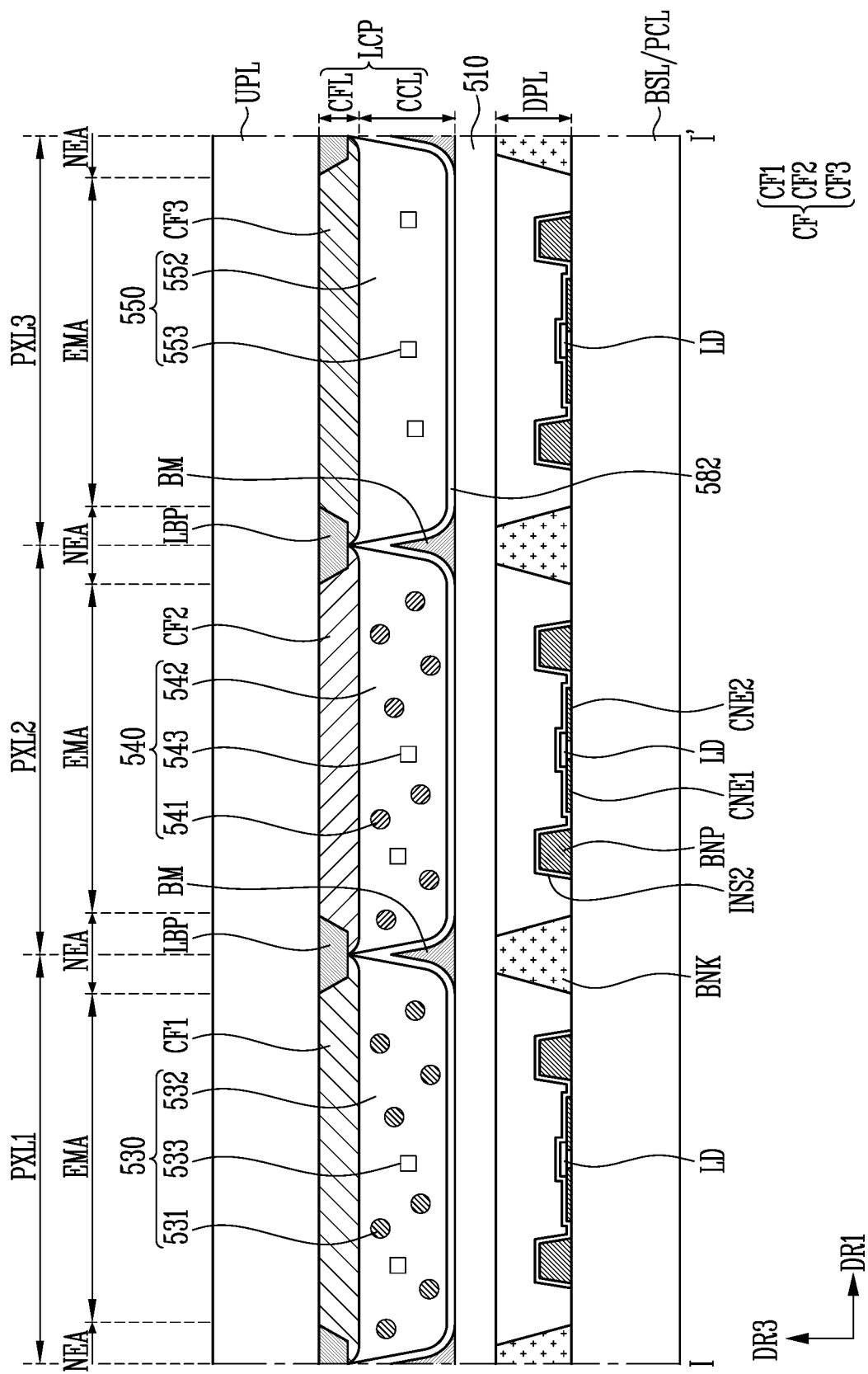
FIG. 9 is a schematic sectional view taken along line I-I' of FIG. 3.

FIG. 9 is a schematic sectional view taken along line I-I' of FIG. 3.

The light controlling layer LCP may be disposed on the display element layer DPL. The light controlling layer LCP may include a color conversion layer CCL and a color filter layer CFL.

In an embodiment, a filler layer 510 may be provided between the display element layer DPL and the light controlling layer LCP. The filler layer 510 may include epoxy, urethane acrylate, epoxy acrylate, silicon-base resin (e.g, bisphenol A-type epoxy, cycloaliphatic epoxy resin, phenyl silicon resin, rubber, aliphatic urethane acrylate, etc.), or a combination thereof. In other embodiments, the filler layer 510 may include one or more materials selected from the group of hexamethyldisiloxane, octamethyltrisiloxane, decamethyltetrasiloxane, dodecamethylpentasiloxane, and polydimethylsiloxanes. However, the material included in the filler layer 510 is not limited to the foregoing examples, and various fillers may be used.

The color conversion layer CCL may include a black matrix BM, wavelength conversion patterns 530 and 540, and a first light transmission pattern 550. The wavelength conversion patterns 530 and 540 may include a first wavelength conversion pattern 530, and a second wavelength conversion pattern 540.

The black matrix BM may be disposed between the color filter layer CFL and the display element layer DPL in a non-emission area NEA. The black matrix BM may define the emission area EMA and the non-emission area NEA.

The emission area EMA may refer to an area from which light may be emitted, and the non-emission area NEA may refer to an area from which light may not be emitted. For example, an area in which the black matrix BM may be disposed may correspond to the non-emission area NEA from which light may not be emitted. The black matrix BM may include light shielding and/or reflective material.

The first wavelength conversion pattern 530 may be disposed in the emission area EMA of the first pixel PXL1, in a plan view.

The first wavelength conversion pattern 530 may include a first wavelength conversion material 531, a first base resin 532, and a first scatterer 533.

The first wavelength conversion material 531 may convert a peak wavelength of light applied thereto. For example, the first wavelength conversion material 531 may convert blue light to red light having a wavelength ranging from about 610 nm to about 650 nm.

The first wavelength conversion material 531 may be a quantum dot (QD), a quantum rod, or a fluorescent substance.

Here, a quantum dot may mean particle material which emits light having a specific wavelength while an electron makes a transition from the conduction band to the valence band. The quantum dot may be semiconductor nanocrystal material. The quantum dot may have a specific bandgap depending on the composition and the size thereof, and thus absorb light and emit light having an intrinsic wavelength. Examples of a semiconductor nanocrystal of quantum dot may include a group IV nanocrystal, a group II-VI compound nanocrystal, a group III-V compound nanocrystal, a group IV-VI nanocrystal, or a combination thereof.

The first base resin 532 may have high light transmissivity and be excellent in dispersion characteristics for the first wavelength conversion material 531. For example, the first base resin 532 may include organic material such as epoxy resin, acrylic resin, cardo resin, imide resin, or a combination thereof.

The first scatterer 533 may have a refractive index different from that of the first base resin 532 and form an optical interface with the first base resin 532. The first scatterer 533 may be a light scattering particle. For instance, the first scatterer 533 may be a metal oxide particle or an organic particle.

The second wavelength conversion pattern 540 may be disposed in the emission area EMA of the second pixel PXL2, in a plan view. The second wavelength conversion pattern 540 may include a second wavelength conversion material 541, a second base resin 542, and a second scatterer 543.

The second wavelength conversion material 541 may convert a peak wavelength of light applied thereto. For example, the second wavelength conversion material 541 may convert blue light to green light having a wavelength ranging from about 510 nm to about 550 nm.

The second wavelength conversion material 541 may be a quantum dot, a quantum rod, or a fluorescent substance.

The second base resin 542 may have high light transmissivity and be excellent in dispersion characteristics for the second wavelength conversion material 541. For example, the second base resin 542 may include organic material such as epoxy resin, acrylic resin, cardo resin, imide resin, or a combination thereof, in a same manner as that of the first base resin 532.

The second scatterer 543 may have a refractive index different from that of the second base resin 542 and form an optical interface with the second base resin 542. The second scatterer 543 may be a light scattering particle.

The first light transmission pattern 550 may be disposed in the emission area EMA of the third pixel PXL3, in a plan view. The first light transmission pattern 550 may include a third base resin 552 and a third scatterer 553.

The third base resin 552 may have high light transmissivity and be excellent in dispersion characteristics for the third scatterer 553. For example, the third base resin 552 may include organic material such as epoxy resin, acrylic resin, cardo resin, imide resin, or a combination thereof, in a same manner as that of the first base resin 532.

The third scatterer 553 may have a refractive index different from that of the third base resin 552 and form an optical interface with the third base resin 552. For example, the third scatterer 553 may be a light scattering particle.

The capping layer 582 along with a color filter CF may seal the first wavelength conversion pattern 530, the second wavelength conversion pattern 540, and the first light transmission pattern 550, thus preventing external impurities such as water or air from permeating and damaging or contaminating the first wavelength conversion pattern 530, the second wavelength conversion pattern 540, or the first light transmission pattern 550. The capping layer 582 may include at least inorganic material or organic material.

The color filter layer CFL may include a light blocking pattern LBP and color filters CF. The color filters CF may include a first color filter CF1, a second color filter CF2, and a third color filter CF3.

The light blocking pattern LBP may be disposed in the non-emission area NEA. The light blocking pattern LBP may be disposed along a boundary of the emission area EMA and block light transmission. The light blocking pattern LBP may include light shielding material. In accordance with an embodiment, the light blocking pattern LBP and the block matrix BM may be formed of a same material, but the disclosure is not limited thereto.

Any of the color filters CF may selectively allow light having a specific wavelength to pass therethrough, and absorb light having a wavelength different from the specific wavelength. The light that has passed through the color filter CF may express one of the three primary colors including red, green, and blue. However, the color expressed by the light that has passed through the color filter CF is not limited to the primary colors, and the light may express any of cyan, magenta, yellow, and white colors.

The first color filter CF1 may be disposed on the emission area EMA of the first pixel PXL1. The first color filter CF1 may allow a first color of light to pass therethrough and absorb a second color of light and a third color of light. The first color filter CF1 may include colorant for the first color.

The second color filter CF2 may be disposed on the emission area EMA of the second pixel PXL2. The second color filter CF2 may allow the second color of light to pass therethrough and absorb the first color of light and the third color of light. The second color filter CF2 may include colorant for the second color.

The third color filter CF3 may be disposed on the emission area EMA of the third pixel PXL2. The third color filter CF3 may allow the third color of light to pass therethrough and absorb the first color of light and the second color of light. The third color filter CF3 may include colorant for the third color.

The upper substrate may be disposed on the light controlling layer LCP. The upper substrate UPL may include material having light permeability. The upper substrate UPL may be a rigid substrate or a flexible substrate. For example, the upper substrate UPL may be a window component or an encapsulation substrate.

Hereinafter, a display device and a method of manufacturing the display device in accordance with an embodiment will be described with reference to FIGS. 10 to 13.

FIGS. 10 to 13 are schematic sectional views illustrating a method of manufacturing a display device in accordance with an embodiment of the disclosure.

Figure 10:
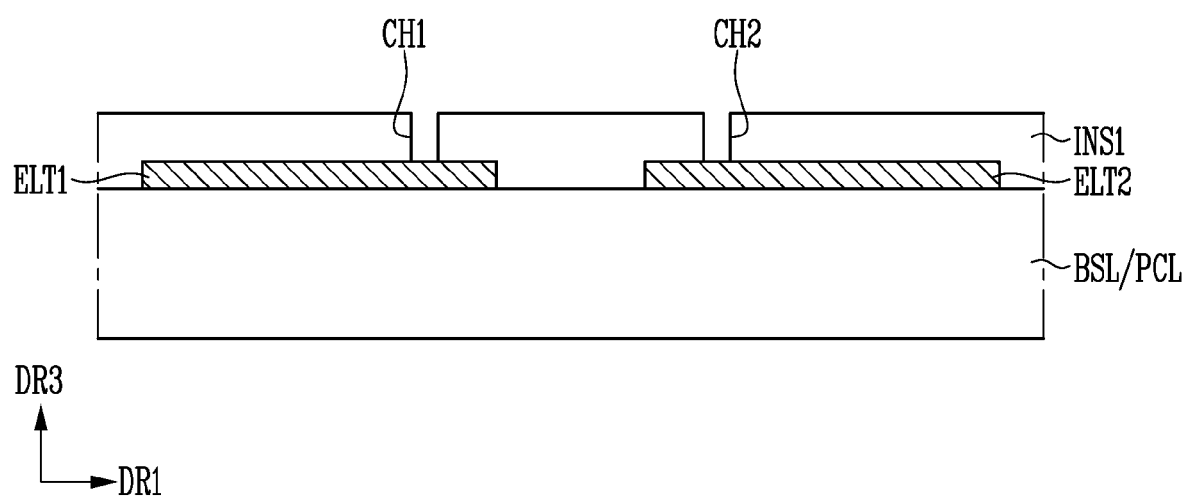
FIGS. 10 to 13 are schematic sectional views illustrating a method of manufacturing a display device in accordance with an embodiment of the disclosure.
Figure 11:
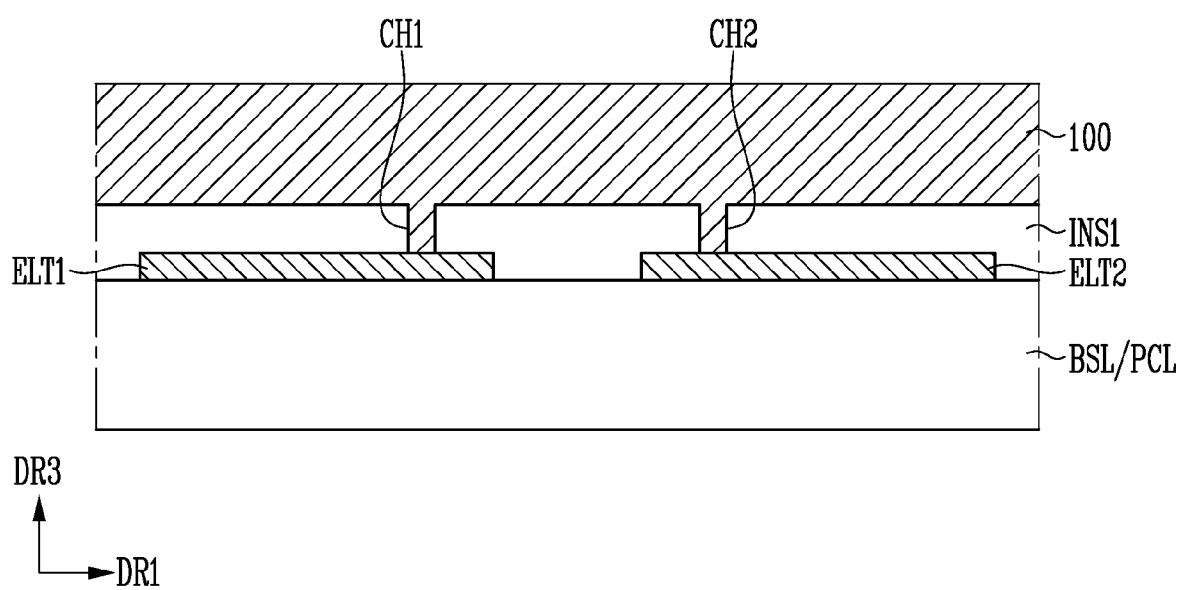

Referring to FIG. 10, the base layer BSL and the pixel circuit layer PCL disposed on the base layer BSL may be disposed (e.g., prepared). The first electrode ELT1 and the second electrode ELT2 may be formed on the pixel circuit layer PCL. Although not illustrated in detail in FIG. 10, the first electrode ELT1 and the second electrode ELT2 may be respectively and electrically connected to the first contactor CNT1 and the second contactor CNT2 that may be provided on the pixel circuit layer PCL. The first insulating layer INS1 may be disposed to cover the first electrode ELT1 and the second electrode ELT2.

The contact holes CH1, CH2 may be formed in the first insulating layer INS1 and respectively connected to the first electrode ELT1 and the second electrode ELT2 in a fluidic manner. Each of the contact holes may have a hole shape passing through the first insulating layer INS1.

Referring to 11, the transparent conductive polymer layer 100 may be disposed on the first insulating layer INS1. The transparent conductive polymer layer 100 may include a transparent conductive polymer.

In an embodiment, the transparent conductive polymer may include at least one of poly(3,4-ethylenedioxythiophene):polystyrene sulfonate (PEDOT:PSS), polyacetylene, polypyrrole, polythiophene, poly(para-phenylene), poly(3,4-ethlenedixoythiophene), polyphenylene sulfide, poly(para-phenylene vinylene), and polyaniline, but the disclosure is not limited thereto.

In an embodiment, a dopant may be added to the transparent conductive polymer layer 100 to enhance the electrical conductivity of the transparent conductive polymer layer 100.

For example, the dopant may include at least one of dimethyl sulfoxide, N-methylpyrrolidone, ethylene glycol, methanol, ethanol, and isopropyl alcohol.

The thickness of the transparent conductive polymer layer 100 may be at least less than or equal to the thickness of the bank pattern BNP to be formed later.

At least a portion of the transparent conductive polymer layer 100 may be disposed in an area in which the first contact electrode CNE1, the second contact electrode CNE2, and the bank pattern BNP may be disposed. In other words, at least a portion of the transparent conductive polymer layer 100 that may not be removed through an etching process which may be performed after the transparent conductive polymer layer 100 has been disposed on the first insulating layer INS1 may be at least one of the first contact electrode CNE1, the second contact electrode CNE2, and the bank pattern BNP.

At least a portion of the transparent conductive polymer layer 100 may be provided in a through hole formed in the first insulating layer INS1. At least a portion of the transparent conductive polymer layer 100 may be provided in each of the first contact hole CH1 and the second contact hole CH2. The transparent conductive polymer layer 100 may include the transparent conductive polymer and thus have an electrical conductivity, so that the first electrode ELT1 and the second electrode ELT2 may be electrically connected to the transparent conductive polymer layer 100 through the first contact hole CH1 and the second contact hole CH2, respectively.

Figure 12:
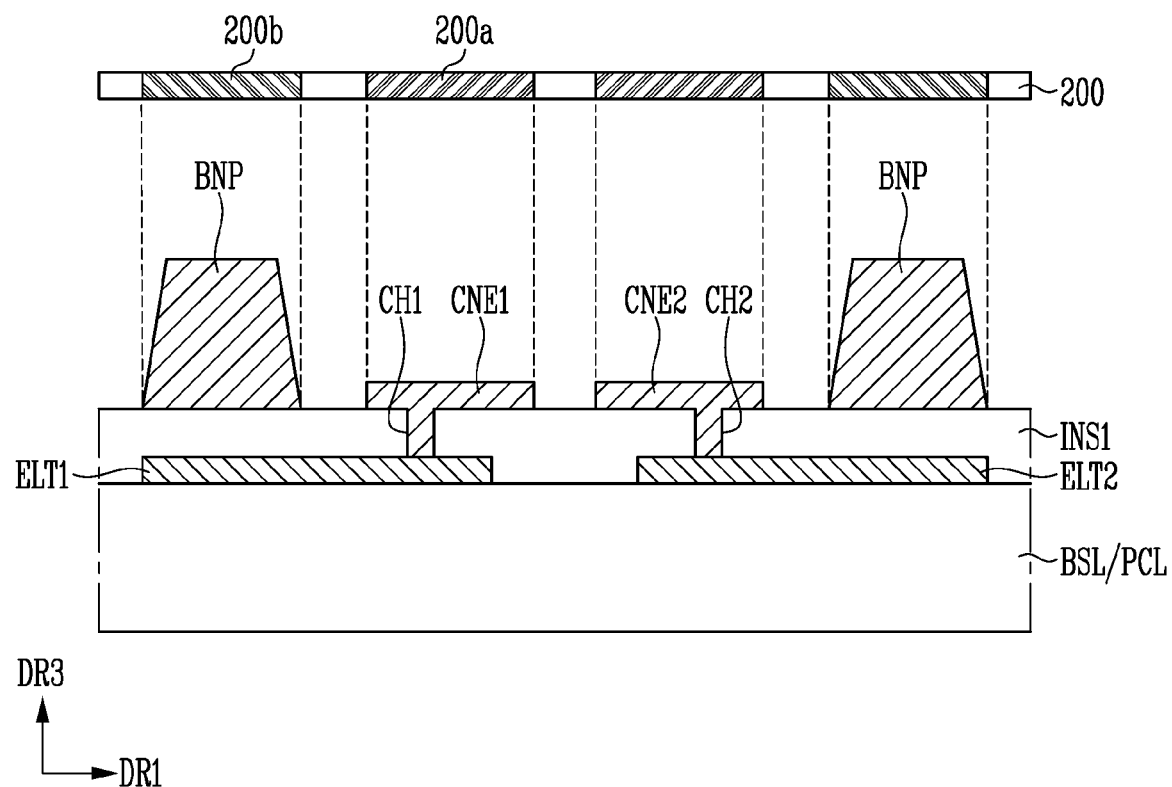

Referring to FIG. 12, a photolithography process, a developing process, and an etching process may be performed for the transparent conductive polymer layer 100. Although not illustrated in the drawings, a photoresist layer including photosensitive material may be applied onto the transparent conductive polymer layer 100.

During the photolithography and developing processes for the transparent conductive polymer layer 100, a first mask 200 including a 1-1-th mask area 200a and a 1-2-th mask area 200b may be used. The light transmissivity of the first mask 200 in the 1-1-th mask area 200a may be less than the light transmissivity of the first mask 200 in the 1-2-th mask area 200b. In an embodiment, the 1-1-th mask area 200a may be a half-tone area, and the 1-2-th mask area 200b may be a full-tone area.

In the case where the photolithography process is performed, the 1-1-th mask area 200a may overlap the first contact electrode CNE1 and/or the second contact electrode CNE2 in a plan view. The 1-2-th mask area 200b may overlap the bank pattern BNP in a plan view.

Due to a difference in light transmissivity between the 1-1-th mask area 200a of the first mask 200 and the 1-2-th mask area 200b of the first mask 200, the amount with which the photoresist layer may be removed may vary by areas of the first mask 200. Hence, after the photolithography process has been performed, the thickness of the photoresist layer in areas corresponding to the first and second contact electrodes CNE1 and CNE2 may differ from the thickness of the photoresist layer in an area corresponding to the bank pattern BNP.

Thereafter, the transparent conductive polymer layer 100 may be etched using as an etching mask the photoresist layer having different thicknesses in at least some areas after the photolithography process has been performed. If the etching process is performed, at least a portion of the transparent conductive polymer layer 100 may be removed, so that the bank pattern BNP and the first and second contact electrodes CNE1 and CNE2 can be provided, and the thickness of the bank pattern BNP may be greater than the thickness of the first and second contact electrodes CNE1 and CNE2.

The bank pattern BNP and the first and second contact electrodes CNE1 and CNE2 may be formed through a same process. The bank pattern BNP and the first and second contact electrodes CNE1 and CNE2 may be formed at a same time. Therefore, compared to the case where the bank pattern BNP and the first and second contact electrodes CNE1 and CNE2 may be formed through separate processes, in an embodiment of the disclosure, a process may be omitted, and the number of masks that may be required may be reduced, so that the processing cost can be reduced.

Figure 13:
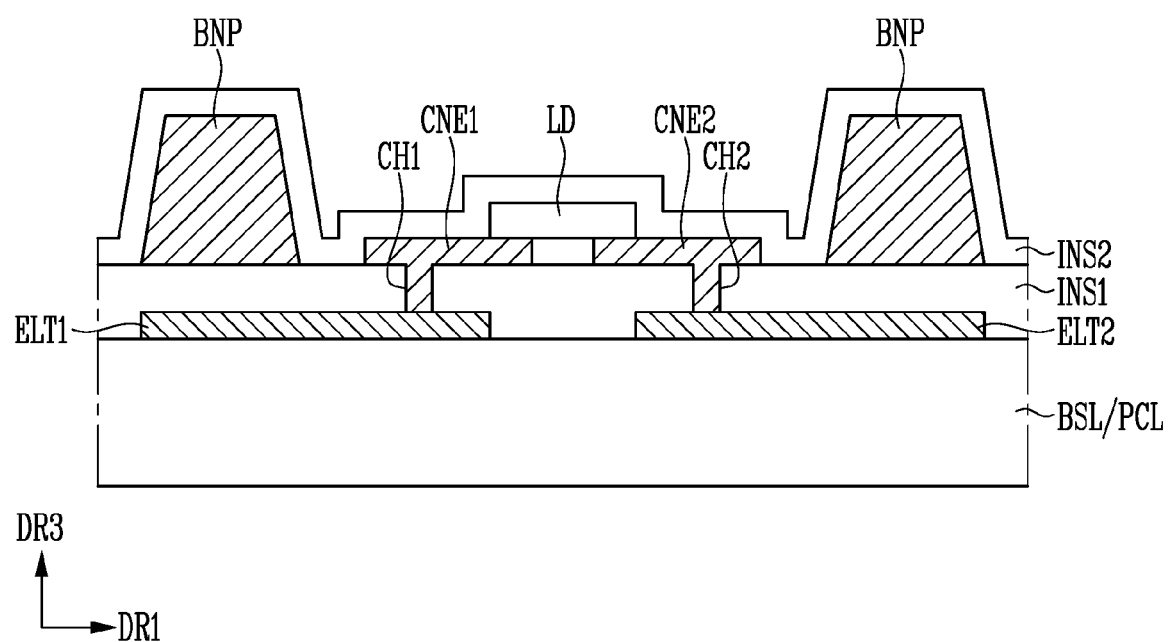

Referring to FIG. 13, the light emitting element LD may be disposed on the first contact electrode CNE1 and the second contact electrode CNE2. As described above with reference to FIG. 7, an end of the light emitting element LD may be electrically connected with the first contact electrode CNE1, and another end of the light emitting element LD may be electrically connected with the second contact electrode CNE2.

The second insulating layer INS2 may be disposed on the bank pattern BNP, the first and second contact electrodes CNE1 and CNE2, and the light emitting element LD. As described with reference to FIG. 7, the second insulating layer INS2 may reduce external effects on the display element layer DPL, particularly, the light emitting element LD.

Hereinafter, a display device and a method of manufacturing the display device in accordance with an embodiment will be described with reference to FIGS. 14 to 18. With regard to this embodiment, duplicative descriptions of the embodiments described above may be simplified.

FIGS. 14 to 18 are sectional views illustrating a method of manufacturing a display device in accordance with an embodiment of the disclosure. Hereinafter, duplicative descriptions with reference to FIGS. 10 to 13 may be simplified or omitted.

Figure 14:
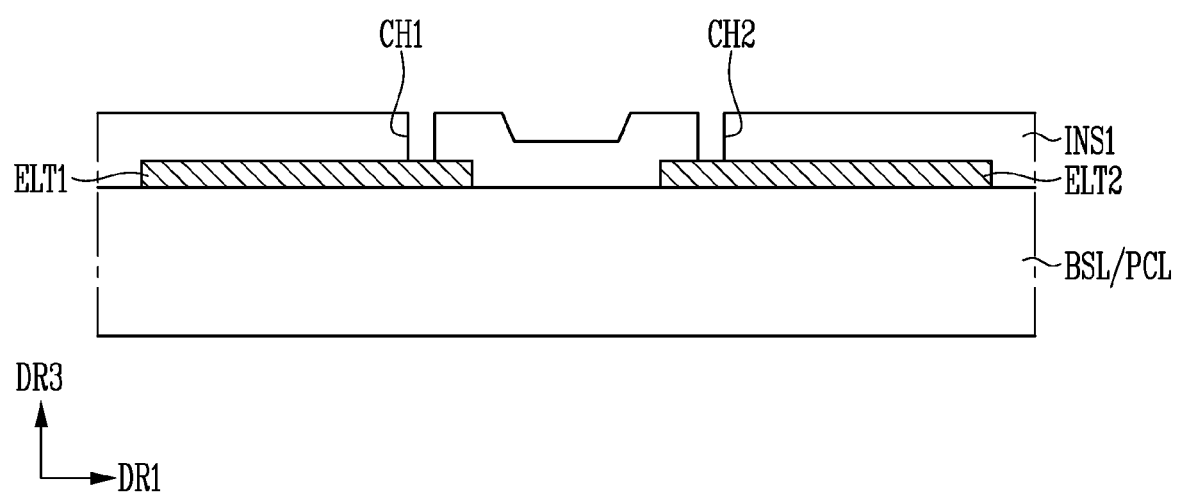
FIGS. 14 to 18 are schematic sectional views illustrating a method of manufacturing a display device in accordance with an embodiment of the disclosure.

Referring to FIG. 14, the base layer BSL and the pixel circuit layer PCL disposed on the base layer BSL may be prepared. The first electrode ELT1 and the second electrode ELT2 may be disposed on the pixel circuit layer PCL.

Figure 15:
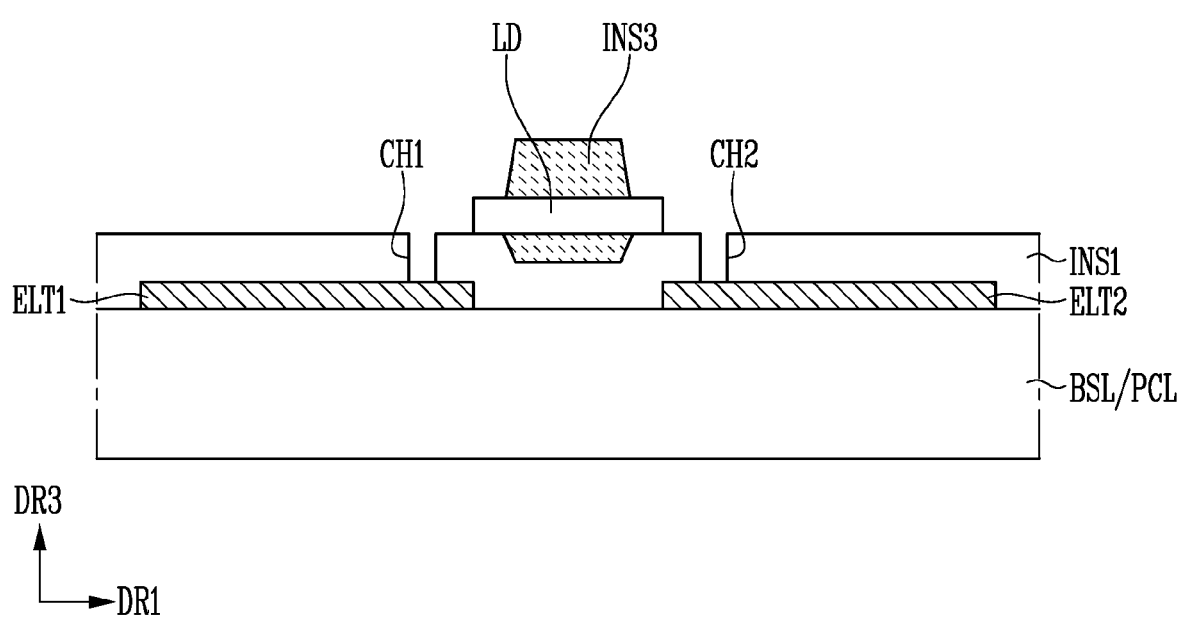

Referring to FIG. 15, the light emitting element LD may be disposed on the first insulating layer INS1. An opening may be provided in the first insulating layer INS1, so that at least a portion of a rear surface of the light emitting element LD may not physically come into contact with the first insulating layer INS1. If the light emitting element LD is disposed on the first insulating layer INS1, the third insulating layer INS3 may be disposed on the light emitting element LD. The third insulating layer INS3 may be disposed on the light emitting element LD such that the first end of the light emitting element LD and the second end thereof opposite to the first end may be open. As described above with reference to FIG. 8, in some embodiments, at least a portion of the third insulating layer INS3 may be provided in the opening of the first insulating layer INS1.

Figure 16:
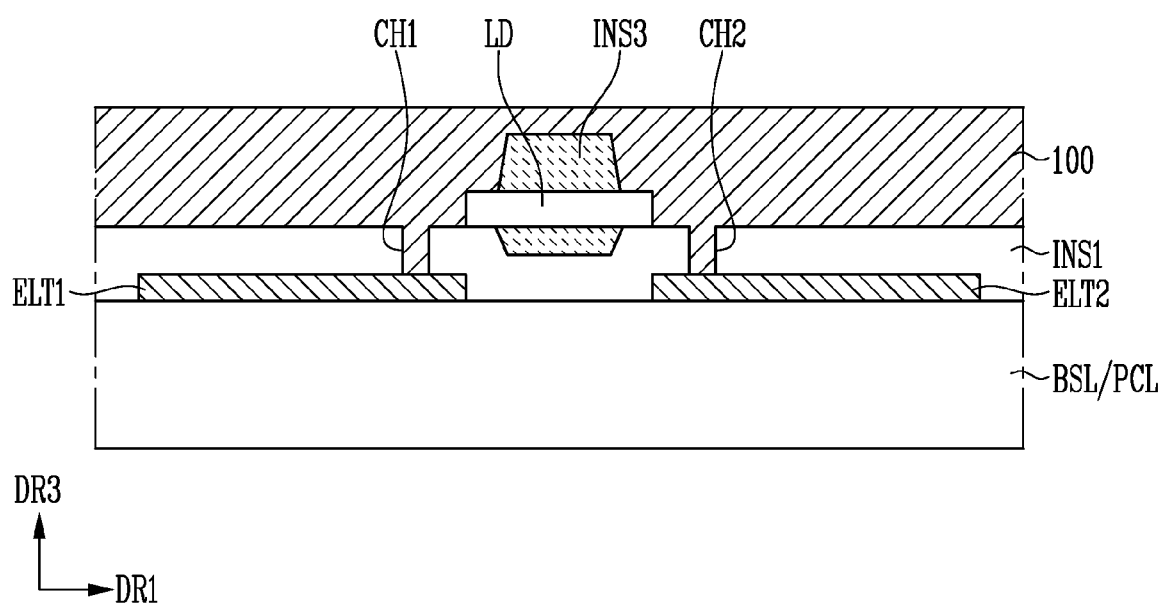

Referring to FIG. 16, the transparent conductive polymer layer 100 may be formed on the first insulating layer INS1. The transparent conductive polymer layer 100 may be disposed to cover at least the light emitting element LD and the third insulating layer INS3. The transparent conductive polymer layer 100 may include at least a transparent conductive polymer having a light transmissivity and an electrical conductivity. At least a portion of the transparent conductive polymer layer 100 may be provided in each of the first contact hole CH1 and the second contact hole CH2 that may be formed in the first insulating layer INS1. Hence, the transparent conductive polymer layer 100 may be electrically connected to the first electrode ELT1 and the second electrode ELT2.

Figure 17:
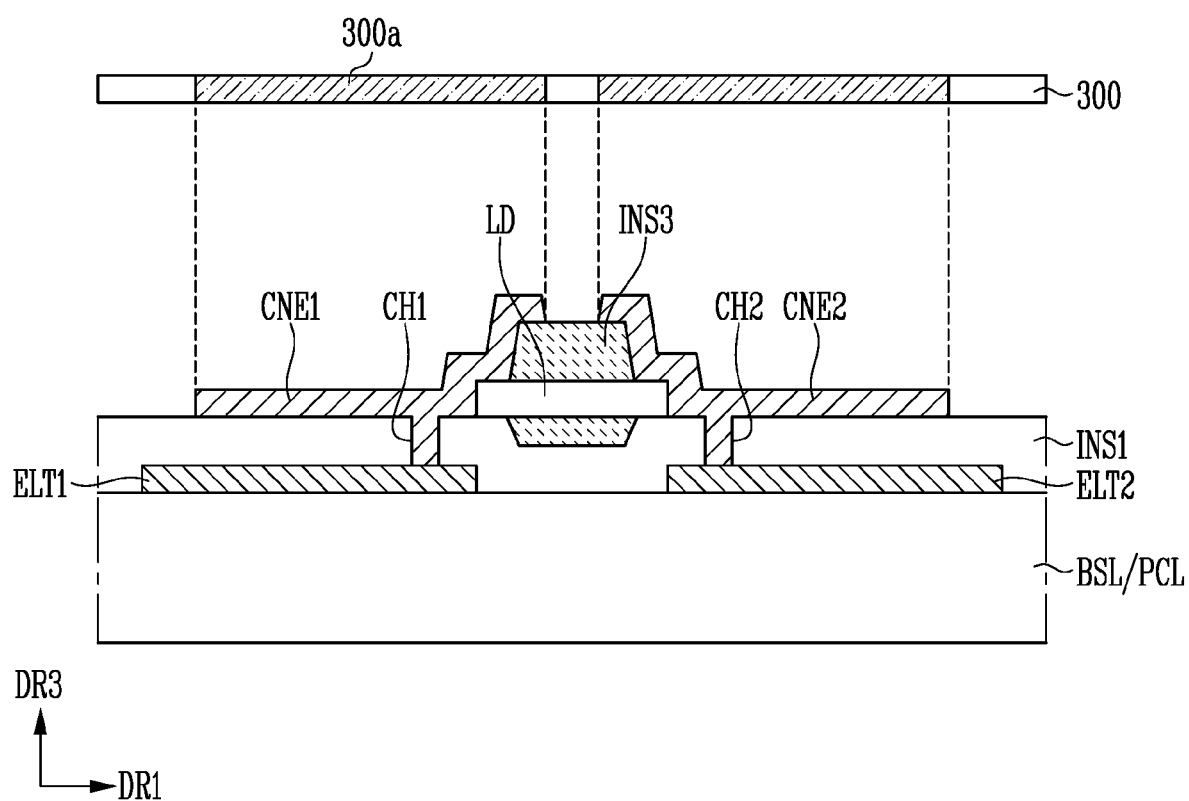

Referring to FIG. 17, after the transparent conductive polymer layer 100 has been formed, a photolithography process, a developing process, and an etching process may be performed on the formed transparent conductive polymer layer 100. Although not illustrated in the drawing, a photoresist layer may be disposed (e.g., placed). During the photolithography and developing processes for the transparent conductive polymer layer 100, the second mask 300 including the second mask area 300a may be used.

The intensity of light that has passed through the second mask area 300a of the second mask 300 may be less than that of incident light. The light transmissivity in the second mask area 300a of the second mask 300 may be greater than that of an area of the second mask 300 other than the second mask area 300a. For example, the second mask area 300a may be a half-tone area.

In the case where the photolithography process is performed, the second mask area 300a of the second mask 300 may overlap the first contact electrode CNE1 and/or the second contact electrode CNE2. In a plan view, an area in which the first contact electrode CNE1 may be disposed and an area in which the second contact electrode CNE2 may be disposed may be disposed in the second mask area 300a. Hence, the thickness of a portion of the photoresist layer that corresponds to the second mask area 300a may differ from the thickness of a portion of the photoresist layer that does not correspond to the second mask area 300a, and the transparent conductive polymer layer 100 may be etched using as an etching mask the photoresist layer, at least a portion of which may be removed during the photolithography process. If the etching process is performed, the first contact electrode CNE1 and the second contact electrode CNE2 may be provided.

Figure 18:
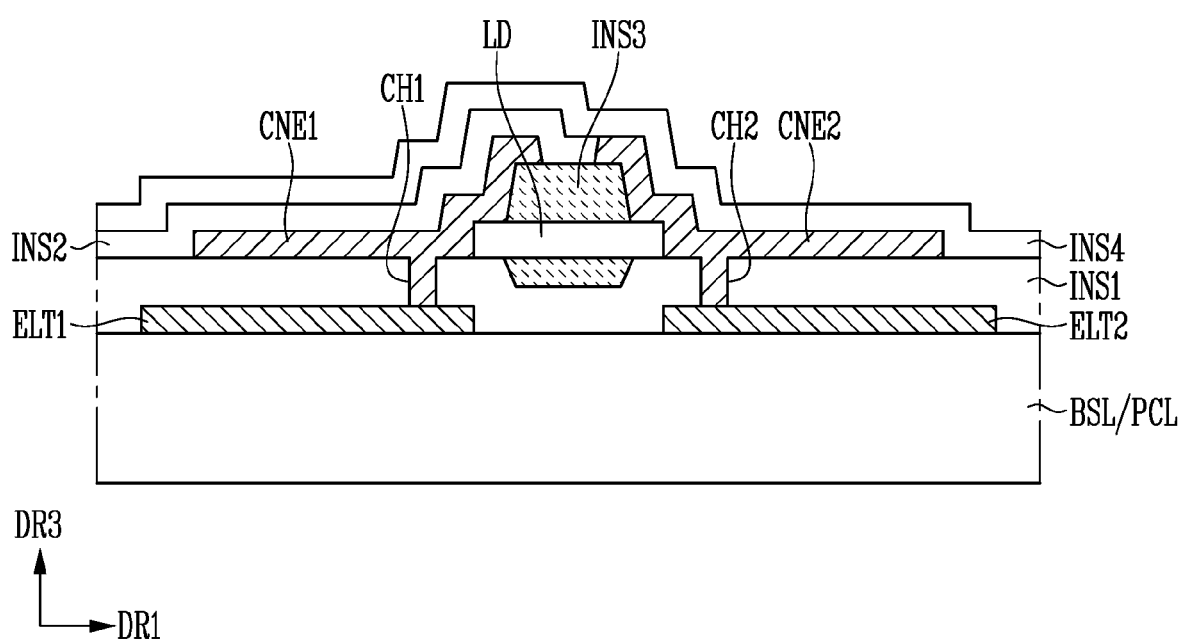

Referring to FIG. 18, the second insulating layer INS2 may be disposed on the first insulating layer INS1 and the first contact electrode CNE1. At least a portion of the second insulating layer INS2 may be disposed on the light emitting element LD and located between the first contact electrode CNE1 and the second contact electrode CNE2. After the first insulating layer INS1 has been disposed, the fourth insulating layer INS4 may be disposed on the first insulating layer INS1, the second insulating layer INS2, and the second contact electrode CNE2. Although FIG. 18 illustrates that at least a portion of the second insulating layer INS2 may be disposed between the first contact electrode CNE1 and the second contact electrode CNE2 and on the first contact electrode CNE1, and the fourth insulating layer INS4 may be disposed on the second insulating layer INS2, the disclosure is not limited thereto. In some embodiments, at least a portion of the fourth insulating layer INS4 may be disposed between the first contact electrode CNE1 and the second contact electrode CNE2 and on the second contact electrode CNE2, and the second insulating layer INS2 may be disposed on the fourth insulating layer INS4.

Consequently, in a display device in accordance with an embodiment, the first contact electrode CNE1 and the second contact electrode CNE2 may be formed through a same process. Moreover, the first and second contact electrodes CNE1 and CNE2 may be formed through a same process as that of the bank pattern BNP. This implies that the processes may be simplified, or some processes may be omitted, so that the cost that may be required to manufacture the display device in accordance with an embodiment can be reduced.

Various embodiments of the disclosure may provide a display device capable of reducing processing cost, and a method of manufacturing a display device.

Effects of the disclosure may not be limited to the above, and other effects of the disclosure will be clearly understandable to those having ordinary skill in the art from the disclosures provided together with accompanying drawings.

Although embodiments of the disclosure have been described for illustrative purposes, those skilled in the art will appreciate that various modifications, additions and substitutions are possible, without departing from the scope and spirit of the disclosure. For example, the above-mentioned embodiments of the disclosure may be implemented separately or in combination.

Accordingly, the embodiments disclosed herein are intended not to limit but to describe the technical spirit of the disclosure, and the scope of the disclosure is not limited to the embodiments. The scope of the disclosure should be construed by the appended claims including equivalents thereof.

What is claimed is:

1. A display device comprising:
   a substrate; and
   a display element layer disposed on the substrate and including a light emitting element that emits light in a display direction, wherein
   the display element layer includes:
      a first contact electrode electrically connected to the light emitting element;
      a second contact electrode electrically connected to the light emitting element; and
      a bank pattern having a shape extending in the display direction,
   the light emitting element is above at least a portion of both the first contact electrode and the second contract electrode, and
   at least one of the first contact electrode, the second contact electrode, and the bank pattern includes a transparent conductive polymer.

2. A display device comprising:
   a substrate; and
   a display element layer disposed on the substrate and including a light emitting element that emits light in a display direction, wherein
   the display element layer includes:
      a first contact electrode electrically connected to the light emitting element;
      a second contact electrode electrically connected to the light emitting element; and
      a bank pattern having a shape extending in the display direction, and
   the first contact electrode, the second contact electrode, and the bank pattern each are formed of a transparent conductive polymer having a same composition ratio.

3. A display device comprising: a substrate: and a display element layer disposed on the substrate and including a light emitting element that emits light in a display direction, wherein the display element layer includes: a first contact electrode electrically connected to the light emitting element; a second contact electrode electrically connected to the light emitting element; and a bank pattern having a shape extending in the display direction, at least one of the first contact electrode, the second contact electrode, and the bank pattern includes a transparent conductive polymer, and the first contact electrode and the second contact electrode are disposed between the substrate and the light emitting element.

4. The display device according to claim 1, further comprising:
   a first electrode electrically connected to the first contact electrode through a first contact hole; and
   a second electrode electrically connected to the second contact electrode through a second contact hole.

5. The display device according to claim 4, further comprising a first insulating layer disposed on the first electrode and the second electrode, wherein
   the first contact hole and the second contact hole are disposed in the first insulating layer, and
   the first contact electrode, the second contact electrode, and the bank pattern are disposed on the first insulating layer.

6. A display device comprising:
a substrate; and
display element layer disposed on the substrate and including a light emitting element that emits in a display direction, wherein
the display element layer includes:
   a first contact electrode electrically connected to the light remitting element;
   a second contact electrode electrically connected to the light emitting element; and
   a bank pattern having a shape extending the display direction, and
at least one of the first contact electrode the second contact electrode, and the bank pattern includes a transparent conductive polymer,
the transparent conductive polymer includes at least one of poly(3,4-ethylenedioxythiophene):polystyrene sulfonate (PEDOT:PSS), polyacetylene, polypyrrole, polythiophene, poly(para-phenylene), poly(3,4-ethlenedixoythiophene), polyphenylene sulfide, poly(para-phenylene vinylene), and polyaniline, and
the transparent conductive polymer includes at least one of dimethyl sulfoxide, N-methylpyrrolidin, ethylene glycol, methanol, ethanol and isopropyl alcohol.

7. The display device according to claim 1, wherein at least two of the first contact electrode, the second contact electrode, and the bank pattern includes a transparent conductive polymer.

8. The display device according to claim 1, wherein the first contact electrode, the second contact electrode, and the bank pattern are all directly disposed on an insulating layer.

* * * * *